(12) United States Patent
Paranjpe

(10) Patent No.: US 7,393,561 B2
(45) Date of Patent: Jul. 1, 2008

(54) METHOD AND APPARATUS FOR LAYER BY LAYER DEPOSITION OF THIN FILMS

(75) Inventor: Ajit P. Paranjpe, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/342,151

(22) Filed: Jan. 13, 2003

(65) Prior Publication Data
US 2003/0134038 A1  Jul. 17, 2003

(51) Int. Cl.
*C23C 16/00* (2006.01)
(52) U.S. Cl. ............. 427/248.1; 427/255.7; 427/255.23
(58) Field of Classification Search ............. 427/248.1, 427/255.23, 255.28, 255.7, 301
See application file for complete search history.

(56) References Cited

U.S. PATENT DOCUMENTS

| | | | |
|---|---|---|---|
| 4,058,430 A | 11/1977 | Suntola et al. | 156/611 |
| 4,105,810 A | 8/1978 | Yamazaki et al. | 427/248 |
| 4,178,877 A | 12/1979 | Kudo | 118/728 |
| 4,258,658 A | 3/1981 | Politycki et al. | 118/719 |
| 4,292,153 A | 9/1981 | Kudo et al. | 204/164 |
| 4,381,965 A | 5/1983 | Maher, Jr. et al. | 156/345 |
| 4,565,157 A | 1/1986 | Brors et al. | 118/719 |
| 4,653,428 A | 3/1987 | Wilson et al. | 118/725 |
| 4,693,777 A | 9/1987 | Hazano et al. | 156/345 |
| 4,728,389 A | 3/1988 | Logar | 117/97 |
| 4,745,088 A | 5/1988 | Inoue et al. | 437/102 |
| 4,767,494 A * | 8/1988 | Kobayashi et al. | 117/93 |
| 4,784,874 A | 11/1988 | Inshihara et al. | 427/49 |
| 4,811,684 A | 3/1989 | Tashiro et al. | 118/50.1 |

(Continued)

FOREIGN PATENT DOCUMENTS

JP          61-197638          9/1986

(Continued)

OTHER PUBLICATIONS

Chemical Vapor Deposition for Microelectronics, A. Sherman, Noyes Publication, Park Ridge, New Jersey, 1987, p. 77.

(Continued)

*Primary Examiner*—Timothy Meeks
*Assistant Examiner*—David Turocy
(74) *Attorney, Agent, or Firm*—Patterson & Sheridan, LLP

(57) ABSTRACT

A method of increasing ALP briefly, a preferred embodiment of the present invention includes a method of increasing ALP throughput by continuously modulating gas flow in a reactor to achieve layer by layer growth on a wafer. A first reactant is introduced with a percentage of a carrier gas. After a first time interval, the first reactant flow is reduced while the carrier gas flow is increased so as to maintain an approximately constant total gas flow. When the first reactant flow reaches a minimal, predetermined amount, a second reactant flow is initiated and increased while the carrier gas flow is decreased so as to continue a constant total gas flow. The method alternatively includes introducing a substance that enhances reactant adsorption and chemisorption, either as a first applied gas that reacts with the surface or as an added ligand to the reactant. Still further alternatives include a periodic rapid thermo anneal for improving film properties, parallel wafer processing and a reactant reservoir.

6 Claims, 18 Drawing Sheets

U.S. PATENT DOCUMENTS

| | | | |
|---|---|---|---|
| 4,829,022 A | 5/1989 | Kobayashi et al. | 437/107 |
| 4,830,890 A | 5/1989 | Kanai | 427/255.1 |
| 4,858,557 A | 8/1989 | Pozzetti et al. | 118/725 |
| 4,870,245 A | 9/1989 | Price et al. | 219/121.38 |
| 4,951,601 A | 8/1990 | Maydan et al. | 118/719 |
| 4,962,726 A | 10/1990 | Matsushita et al. | 118/719 |
| 4,969,416 A | 11/1990 | Schumaker et al. | 118/725 |
| 4,976,996 A | 12/1990 | Monowski et al. | 427/255.5 |
| 5,058,526 A | 10/1991 | Matshushita et al. | 118/715 |
| 5,067,437 A | 11/1991 | Watanabe et al. | 118/715 |
| 5,097,890 A | 3/1992 | Nakao | 165/206 |
| 5,108,792 A | 4/1992 | Anderson et al. | 427/248.1 |
| 5,198,071 A | 3/1993 | Scudder et al. | 117/84 |
| 5,203,956 A | 4/1993 | Hansen | 156/643 |
| 5,225,036 A | 7/1993 | Watanabe et al. | 438/597 |
| 5,272,417 A | 12/1993 | Ohmi | 314/111.21 |
| 5,291,030 A | 3/1994 | Brors | 250/573 |
| 5,300,186 A * | 4/1994 | Kitahara et al. | 117/89 |
| 5,356,475 A | 10/1994 | Diiorio et al. | 118/723 |
| 5,383,984 A * | 1/1995 | Shimada et al. | 156/345.26 |
| 5,391,232 A | 2/1995 | Kanai et al. | 118/715 |
| 5,399,387 A | 3/1995 | Law et al. | 427/574 |
| 5,458,689 A | 10/1995 | Saito | 118/724 |
| 5,458,724 A | 10/1995 | Syverson et al. | 156/345 |
| 5,482,739 A | 1/1996 | Hey et al. | 427/255.2 |
| 5,493,987 A | 2/1996 | McDiarmid et al. | 117/102 |
| 5,551,985 A | 9/1996 | Brors et al. | 118/725 |
| 5,554,220 A * | 9/1996 | Forrest et al. | 117/88 |
| 5,556,521 A | 9/1996 | Ganbari | 118/723 I |
| 5,558,717 A | 9/1996 | Zhao et al. | 118/723 E |
| 5,563,092 A | 10/1996 | Ohmi | 118/723 |
| 5,584,963 A | 12/1996 | Takahashi | 156/646.1 |
| 5,607,724 A | 3/1997 | Beinglass et al. | 427/255.1 |
| 5,613,821 A | 3/1997 | Muka et al. | 414/217 |
| 5,626,678 A | 5/1997 | Sahin et al. | 118/723 E |
| 5,629,043 A | 5/1997 | Inaba et al. | 427/79 |
| 5,663,087 A | 9/1997 | Yokozawa | 438/762 |
| 5,695,566 A | 12/1997 | Suzuki et al. | 118/723 |
| 5,720,821 A | 2/1998 | Halpern | 118/719 |
| 5,795,452 A | 8/1998 | Kinoshita et al. | 204/298.37 |
| 5,844,195 A | 12/1998 | Fairbain et al. | 219/121.43 |
| 5,849,092 A | 12/1998 | Xi et al. | 134/1.1 |
| 5,855,970 A | 1/1999 | Inushima et al. | 427/579 |
| 5,874,129 A | 2/1999 | Beinglass et al. | 427/248.1 |
| 5,910,342 A | 6/1999 | Hirooka et al. | 427/573 |
| 5,916,365 A | 6/1999 | Sherman | 117/92 |
| 5,968,276 A | 10/1999 | Lei et al. | 118/723 R |
| 6,015,590 A | 1/2000 | Suntola et al. | 427/255.23 |
| 6,042,652 A | 3/2000 | Hyun et al. | 118/719 |
| 6,074,518 A | 6/2000 | Imafuu et al. | 156/345 |
| RE36,957 E | 11/2000 | Brors et al. | 118/725 |
| 6,174,377 B1 | 1/2001 | Doering et al. | 118/729 |
| 6,200,893 B1 * | 3/2001 | Sneh | 438/685 |
| 6,258,719 B1 * | 7/2001 | Shah et al. | 438/682 |
| 6,342,277 B1 * | 1/2002 | Sherman | 427/562 |
| 6,511,539 B1 * | 1/2003 | Raaijmakers | 117/102 |
| 2003/0073294 A1 * | 4/2003 | Marsh | 438/484 |
| 2003/0190804 A1 * | 10/2003 | Glenn et al. | 438/689 |

FOREIGN PATENT DOCUMENTS

| | | |
|---|---|---|
| JP | 2001 103833 | 4/1989 |
| JP | 03-011546 | 1/1991 |
| JP | 08-138620 | 5/1996 |
| JP | 2000 150523 | 5/2000 |
| JP | 2001 237193 | 8/2001 |

OTHER PUBLICATIONS

Pierson, Handbook for Chemical Vapor Deposition, Noyes Publications, Park Ridge, New Jersey, USA (1992), pp. 182-185, no month.

Wolf, S. and Tauber, R.N., "Silicon Processing for the VLSI Era, vol. 1—Process Technology" Lattice Press, 1986, pp. 169-170 and pp. 191-194.

Klaus, J.W.; Ott, A.W.; Dillon, A.C.; and George, S.M., "Atomic Layer Controlled Growth of $Si_3N_4$ Films Using Sequential Surface Reactions," *Surface Science*, v. 418, pp. L14-L19, 1998.

Paranjpe, A.; Gopinath, S.; Ornstead, T.; and Bubber, R., "Atomic Layer Deposition of $AlO_x$ for Thin Film Head Gap Applications," *J. Electrochem. Soc.*, 148, pp. G465, 2001.

Klaus, J.W.; and George, S.M. "Atomic Layer Deposition of $SiO_2$ at Room Temperature Using $NH_3$-Catalyzed Sequential Surface Reactions," *Surf. Sci.*, 447, pp. 81-90, 2000.

PCT International Search Report for PCT/US05/029154 dated Mar. 3, 2006.

PCT Written Opinion for PCT/US05/029154 dated Mar. 3, 2006.

* cited by examiner

Fig. 2 Improved ALP cycle

METHOD AND APPARATUS FOR LAYER BY LAYER DEPOSITION OF THIN FILMS

BACKGROUND OF THE INVENTION

1. Field of the Invention

The present invention relates generally to methods and apparatus for deposition of materials on substrates, and more particularly to a method and apparatus for layer by layer deposition of thin films compatible with conventional reactor designs making ALP more amenable to a wider array of reactant sources, ALP reaction chemistries, and reactor geometries without increasing reactor and gas delivery complexity, wherein prior art pump-purge steps are avoided by providing continuously modulated gas flow and pressure, allowing all delivery valves to remain open and diverter lines closed, therefore avoiding rapid cycling of valves between on/off states.

2. Brief Description of the Prior Art

Layer by layer deposition of thin films is becoming increasingly important in semiconductor device fabrication. Layer by layer deposition offers several advantages compared to conventional chemical vapor deposition or chemical vapor epitaxy, including superior control of film thickness, improved across the wafer uniformity, ability to deposit laminated films with a small periodicity of thickness, and significantly improved film properties such as density, conformality, insulating characteristics, etc. especially as the total film thickness is scaled below 10 nm. Layer by layer deposition has been used for a variety of films including metals (Al, W, Ti, etc.), semiconductors (Si, ZnSe, III-V and II-VI compounds), oxides ($SiO_2$, $Ta_2O_5$, $Al_2O_3$, $TiO_2$, $SrTiO_3$, $HfO_2$, $ZrO_2$, etc.), nitrides ($Si_3N_4$, TiN, TaN, AlN), silicides (TaSiN, TiSiN) and nanolaminates of these materials. All these materials have significant industrial relevance in semiconductor devices.

In layer by layer growth, also called atomic layer processing (ALP), the film is deposited approximately a monolayer at a time; i.e. the thickness of each layer is of the order of the inter-atomic spacing and hence the term atomic layer processing. For atomic layer processing, the substrate is sequentially exposed to fluxes of reactants so that the reaction is restricted to a surface reaction between an adsorbed/chemisorbed reactant that saturates the surface, and a second gas phase reactant provided in a subsequent pulse. In this manner, the reaction is usually self-limiting once the surface absorbed reactant is consumed, resulting in a monolayer of the film. Recently it has been shown that sub-monolayers or several mono-layers can be obtained via the same technique prompting a change in nomenclature from atomic layer deposition to alternating layer deposition. The ALP technique has been used to deposit both epitaxial and nonepitaxial films. The process of depositing epitaxial films is termed atomic layer epitaxy (ALE), while the technique for depositing non-epitaxial films is traditionally termed atomic layer deposition (ALD). The vapor source reactants for ALP can be gaseous sources or generated by thermal evaporation, vaporization of liquid sources, or remote plasma dissociation.

The technique for depositing films by sequentially exposing the wafer to various reactants is well known and has been in vogue for over two decades. An important requirement for ALP is the need to isolate the reactants from each other in the gas phase. For most ALP reactions, isolating the reactants in the gas is necessary to prevent gas phase reactions between the reactant sources, and also to suppress any parasitic chemical vapor deposition that could occur if the reactants were to be simultaneously present in the gas phase. The allowable residual level of one precursor when the other is introduced is process dependent. One criterion for determining the allowable residual level of one precursor is the contribution of parasitic CVD to the overall deposition rate. For an ALP process, the contribution of the parasitic CVD to the overall deposition rate should typically be less than 10%, although higher values may be tolerable if the film properties, film uniformity and step coverage do not suffer. In fact, parasitic CVD may be used to enhance the deposition rate of the otherwise slow ALP processes. For some processes, the contribution of CVD to the overall deposition rate must be <1% to avoid particulate generation gas phase reaction. Perfect isolation of the precursors from each other during ALP is not required and in some cases may also be undesirable. Some parasitic CVD can prevent adverse reverse reactions from occurring that would otherwise etch the film being deposited. Thus a number of methods have been described in the literature for partial isolation of the precursors. One method to isolate the reactants is to confine them to different regions and move the substrates between the different regions to expose the substrates to alternating doses of the multiple reactants. This method is described in U.S. Pat. No. 4,058,430. A disadvantage of this method is that it is difficult to implement in a conventional reactor used for chemical vapor deposition, and especially for processes that require high reactant partial pressures over the substrate in order to achieve complete surface saturation. Another method to isolate the reactants is to feed the reactants in the form of pulses sequentially through separate delivery lines into a vacuum chamber containing one or more substrates. An evacuation or pumping step is performed in between consecutive pulses to evacuate the chamber of one reactant prior to introducing the next reactant. U.S. Pat. No. 4,058,430 describes this more commonly used approach of exposing a stationary substrate to alternating pulses of reactants and using an evacuation or pumping step in between the pulses to evacuate the chamber of reactants. U.S. Pat. No. 4,058,430 describes both atomic layer deposition and atomic layer epitaxy in which substrates are exposed to alternating pulses of reactants that are isolated from each other in the delivery system and in the chamber. In either of these techniques perfect isolation of the precursors is not achieved, but the residual concentration of one precursor can be decreased to an arbitrarily low level before the other precursor is introduced.

Improvements to the ALD sequence have been proposed. One improvement is to introduce a purge gas simultaneously during the evacuation step. This is generally termed a pump-purge step. The purge gas can act as a gas diffusion barrier preventing the interactions between reactants when all reactants and the purge gas follow the same flow path from the gas inlet to the chamber exhaust. This improvement is described in U.S. Pat. No. 4,389,973. This purge gas flow coupled with simultaneous evacuation of the chamber also reduces the residual concentration of the reactant to trace levels (<1%) as described in U.S. Pat. No. 6,015,590. Multiple pump-purge steps may be used to reduce reactant concentrations in the chamber even further before the next reactant pulse is introduced into the chamber. This mode of ALP is widely used because of its simplicity and ease of adaptability to a wide range of CVD reactor configurations, and is hereinafter referred to as the conventional ALP technique. For single wafer ALP reactors, this approach provides a faster way to evacuate the reactant from the chamber compared to using pumping alone. This is because simultaneous purging while pumping can reduce the concentration of the precursor to trace levels on time scales shorter than 1-2 s, while it takes considerably longer (2-5 s) if pumping alone were to be used.

A conventional ALP sequence is show in FIG. 1. Note the reactant pulsing and pump/purge steps.

Typical deposition rates for ALP are 1 monolayer/cycle, which translates to ~1 Å/cycle. Each cycle according to the conventional ALP technique consists of the following steps:
- Introduce a pulse of reactant 1 to form an adsorbed/chemisorbed layer on the substrate,
- Simultaneously pump the reactor while purging the reactor with a pulse of a purge gas that is typically inert to reduce the residual concentration of reactant 1 in the gas phase to trace levels.
- Introduce a pulse of reactant 2 into the chamber to react with the adsorbed/chemisorbed layer on the substrate resulting in the formation of the film.
- Simultaneously pump the reactor while purging the reactor with a pulse of a purge gas that is typically inert to reduce the residual concentration of reactant 2 in the gas phase to trace levels.

Thus the simplest ALP cycle consists of four distinct pulses/steps of gases. For a typical film thickness of 30-100 Å, the number of ALP cycles ranges from 30-100 cycles. Clearly, in order to achieve a high wafer throughput, a short cycle time must be achieved. Ideally a cycle time of 10 s or less allows 6 cycles/min or an equivalent deposition rate of 6 Å/min. Thus the maximum throughput for a single wafer process module that processes one wafer at a time ranges from 10-12 wph for 30 Å films and from 3-4 wph for 100 Å films. Contrast this with wafer throughputs of 20-30 wph for conventional single wafer CVD modules. For the ALP process to be cost-effective for volume production of semiconductor devices, a 5×-10× improvement in wafer throughput is necessary.

A high throughput for ALD is necessary for several reasons. Naturally, a high throughput reduces the cost of ownership for the process. More importantly, the ALD process is often used in conjunction with other high throughput processes on a vacuum integrated cluster tool. A good example is a cluster tool for a high-k gate stack that consists of modules for pre-cleaning, interfacial oxynitride growth, ALD hi-k deposition and gate electrode deposition. The module with the lowest throughput governs the throughput of such a cluster tool. Ideally the modules should be matched in throughput for maximum productivity.

Cycle times of 10s for conventional ALP also necessitate extremely short pulse and pump—purge times of the order of 2-3 s. As discussed before, cycle times longer than 10 s for single wafer ALP significantly compromise wafer throughput and thus are not production-worthy. The need to achieve short pulse and pump-purge times introduces additional hardware and process complexity including the following:

The reactant and purge gas delivery system must be designed so that reactant and purge gas transit times from the delivery system into the reactor are substantially shorter than the pulse duration. Generally this can be achieved by locating the gas delivery system close to the reactor chamber, minimizing the delivery line volume and using a carrier gas to transport the reactants to the chamber.

The reactant gas and purge gas flow components must toggle between the off state and the flow regulation state on the time scales of a fraction of second so that stable flows can be achieved during each reactant pulse. This is achievable for gaseous reactant sources but is more complicated for liquid reactant sources, remote plasma reactant sources, and other sources that respond on the time scales of several seconds. For these sources, a diverter line that delivers the flow directly into the foreline of the pump can be implemented. However, the danger of reactants mixing in the foreline of the pump leading to particulate formation must be addressed. In addition, reactants diverted into the foreline of the pump are wasted.

Repeated rapid cycling of flow components such as flow controllers and valves between the off state and the on state can result in pressure bursts in the chamber and increased particle generation/release in the flow components adversely impacting particle performance of the process. In addition, reliability of these components under constant cycling between the off state and the on state has proven to be a major concern.

For some ALP processes such as SiN using $SiCl_4/NH_3$, the reactant exposure dose for complete surface saturation exceeds 100 Torr.s; i.e., if the partial pressure of the reactant above the wafer is 1 Torr, an exposure time of 100 s is required. The alternative is to use high partial pressures of reactants, for example 10 Torr for 10 s. This is impractical in most instances involving liquid sources for the reactants since the vapor pressure of the liquid source is insufficient to achieve the desired partial pressure.

In many ALP sequences, the reactive byproducts although present at a low concentration can drive the reaction in the reverse direction resulting in atomic layer etching. This is undesirable and must be avoided. This phenomenon typically occurs in ALP reactions that generate HF or HCl as reaction byproducts. For example, in ALP of TiN with $TiCl_4$ and $NH_3$, the HCl byproduct can etch the formed TiN unless a low residual background pressure of $TiCl_4$ that suppresses the reverse reaction is present. During the deposition of compound semiconductor films such as GaAs, using sequential pulses of Ga and As, a low partial pressure of As must be present during the Ga pulse to prevent evaporation of As from the deposited film. A low partial pressure of the reactant may also be necessary to keep the reactant from desorbing during the purge step.

Deposition temperatures for ALP are typically lower than the equivalent CVD temperatures. This is because complete saturation of all surface sites is necessary which occurs at a temperature range that is slightly lower than used for the equivalent CVD process. For example, TiN can be deposited from $TiCl_4/NH_3$ using the ALP sequence at 350-450° C., while CVD process temperatures are 450-550° C. One of the drawbacks from operating at lower temperatures is that the reactions may not go to completion; which may result in non-stoichiometric films or films with higher impurity contents. For example, in films deposited with non-chlorinated precursors, residual chlorine contamination is usually an issue. Similarly for films deposited with organic precursors, carbon and hydrogen contamination are prevalent. Radical assisted ALP has been used to ameliorate these problems with reasonable success, but the exposure times are fairly long, which extends the duration of the ALP cycle degrading throughput. Using plasma annealing or plasma densification can accelerate the process, but because plasma ions have a finite penetration depth into the film, the removal of impurities is not uniform through the thickness of the film. Also, exposing the film directly to a plasma can result in plasma-induced damage to the film or underlying device structures, in addition to enhancing surface contaminants. Making a reactor chamber compatible with both ALP and plasma processing with good plasma uniformity is also a non-trivial engineering task.

SUMMARY

An object of the present invention is to provide a method and apparatus for increasing wafer throughput in an ALP process.

A further object of the present invention is to enhance wafer throughput in an ALP system by utilizing a parallel wafer processing module so that the throughput is higher than with single wafer ALP reactors, and more competitive with conventional single wafer CVD reactors.

An object of the present invention is to provide an improved method for separating reactants in an ALP system delivery apparatus reactor chamber, and reactor exhaust line that is compatible with conventional reactor designs and eliminates the need for pump-purge steps as practiced in conventional ALP, making ALP more amenable to a wider array of reactant sources, ALP reaction chemistries, and reactor geometries without increasing reactor and gas delivery complexity.

An additional objective of the present invention is to reduce the minimum reactant exposure doses required by increasing the adsorption/chemisorption rates of reactants on the substrate surface.

It is still another object of the present invention to suppress reverse reactions that can occur during ALP thereby retaining good film integrity.

A further object of the present invention is to enhance the wafer throughput for atomic layer processing by utilizing a parallel wafer processing module so that the throughput is much higher than single wafer ALP reactors and more competitive with conventional single wafer CVD reactors.

Yet another object of the present invention is to provide a method for removing impurities from the ALP films without inducing damage or increasing surface impurities by using rapid thermal assisted ALP.

Briefly, a preferred embodiment of the present invention includes a method of increasing ALP throughput by continuously modulating gas flow in a reactor to achieve layer by layer growth on a wafer. A first reactant is introduced with a percentage of a carrier gas. After a first time interval, the first reactant flow is reduced while the carrier gas flow is increased so as to maintain an approximately constant total gas flow. When the first reactant flow reaches a minimal, predetermined amount, a second reactant flow is initiated and increased while the carrier gas flow is decreased so as to continue a constant total gas flow. The method alternatively includes introducing a substance that enhances reactant adsorption and chemisorption, either as a first applied gas that reacts with the surface or as an added ligand to the reactant. Still further alternatives include a periodic rapid thermo anneal for improving film properties, parallel wafer processing and a reactant reservoir.

An advantage of the present invention is that it reduces the cost of reactants as a result of reducing reactant exposure doses and exposure time.

A further advantage of the present invention is that it prevents the occurrence of reverse reactions that cause undesired atomic layer etching.

A still further advantage of the present invention is that it provides a method and apparatus that increases the throughput of wafer processing.

IN THE DRAWING

DESCRIPTION OF THE PREFERRED EMBODIMENTS

Figure 2:
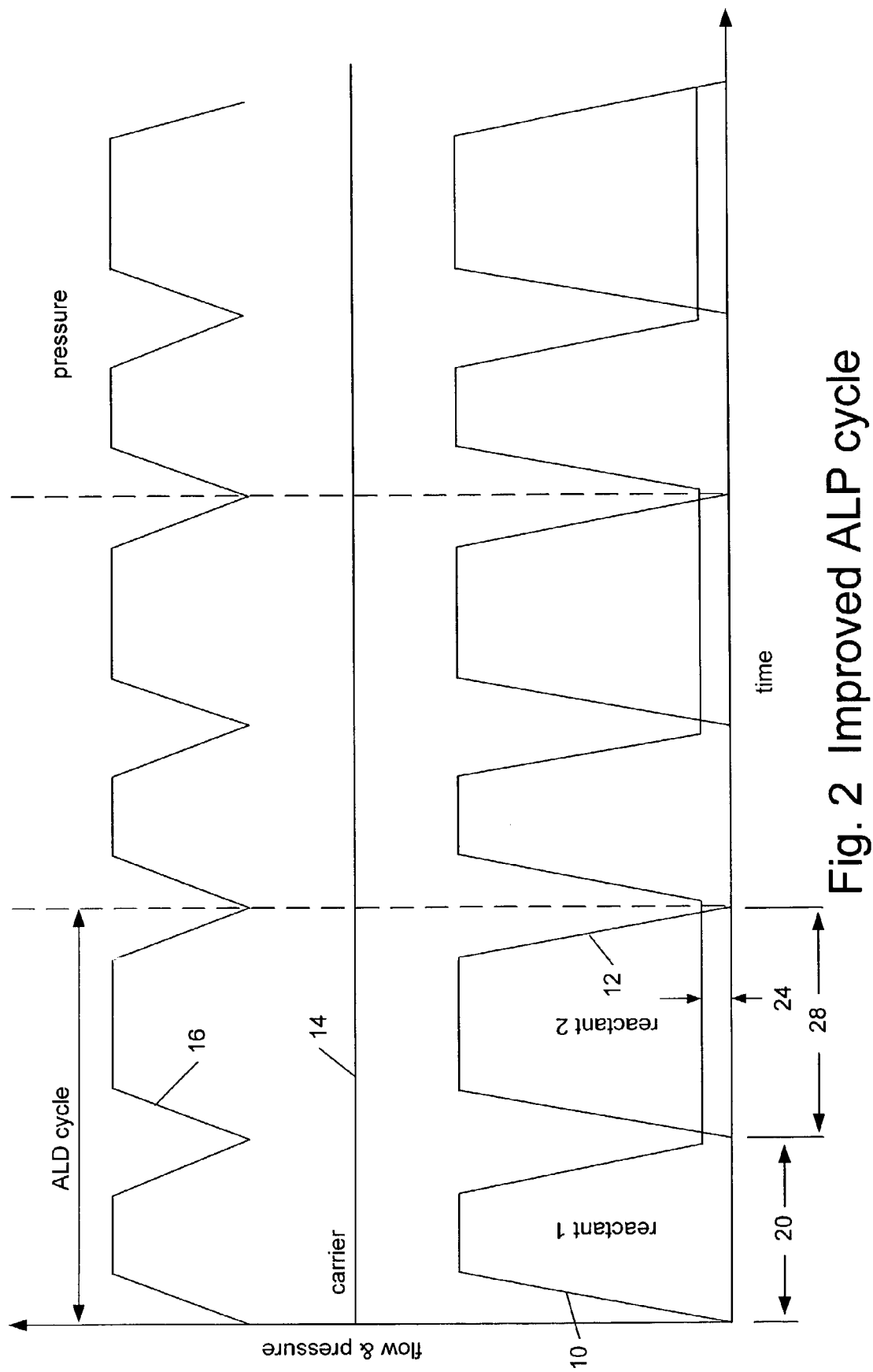
FIG. 2 is a graph illustrating flow and pressure, variations as a function of time for an embodiment of the present invention.
Figure 3:
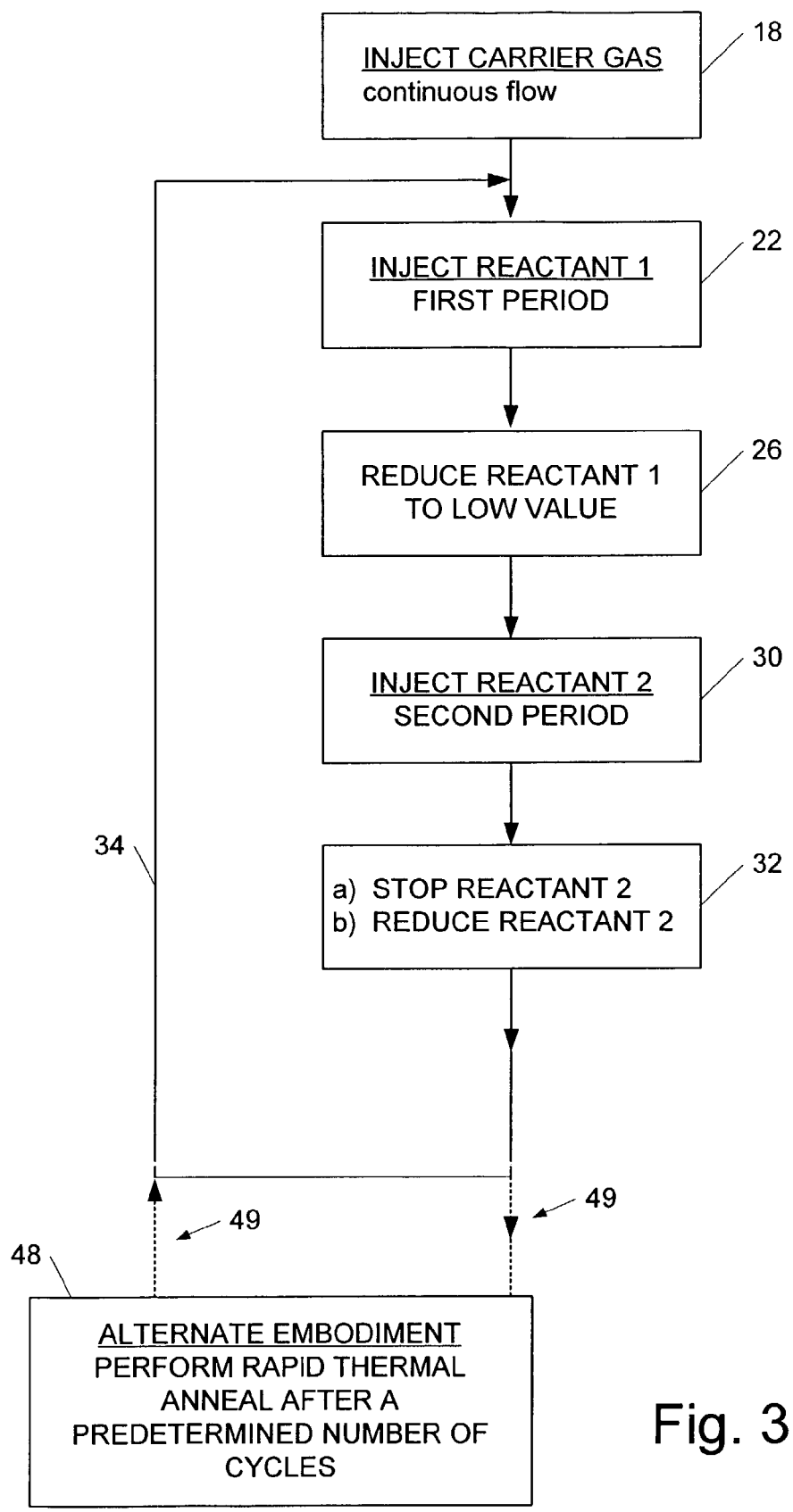
FIG. 3 is a flow chart of ALP operations according to the present invention.
Figure 4:
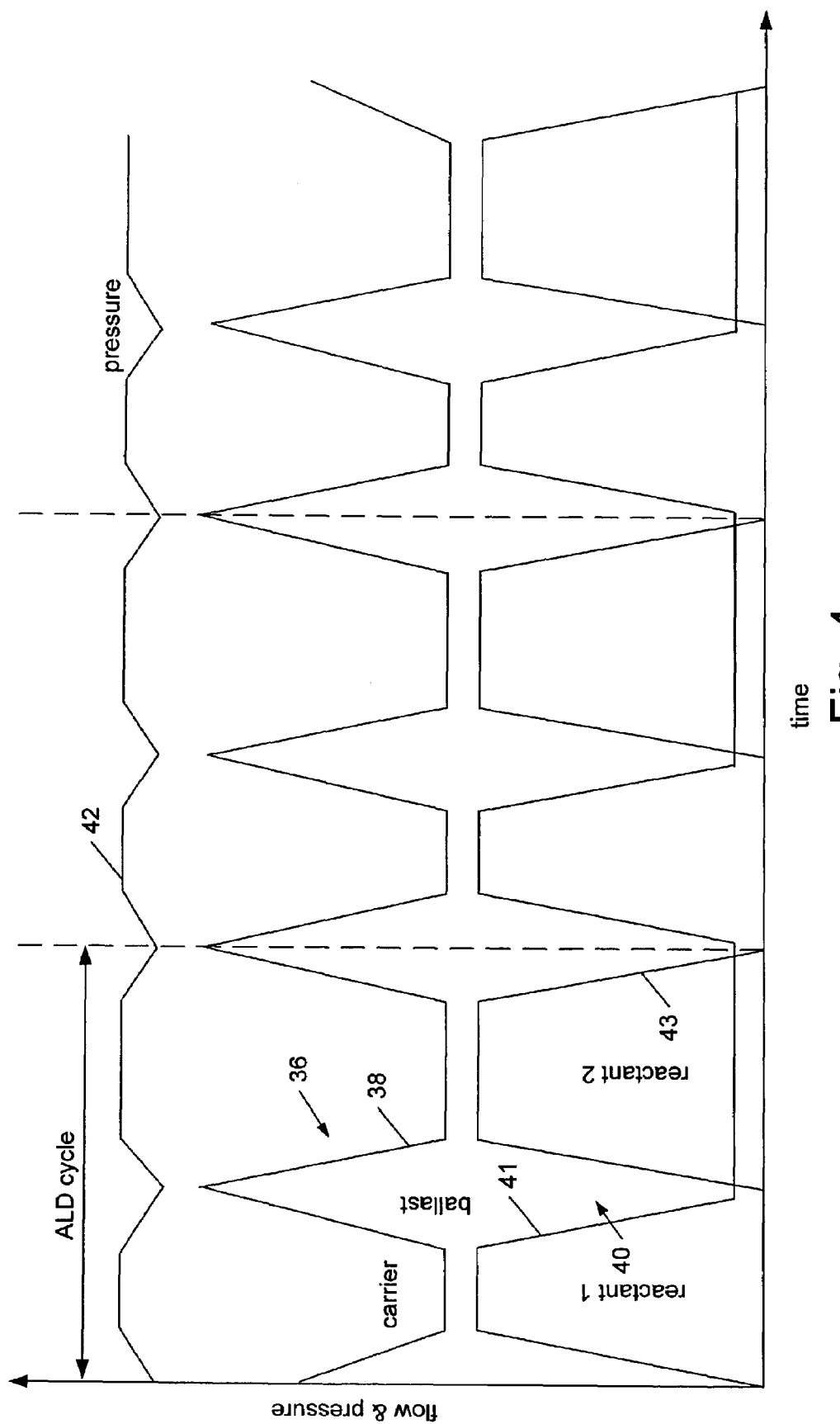
FIG. 4 is a graph of an alternate embodiment of the gas flow of the present invention.

A preferred embodiment of the method of atomic layer processing of the present invention will now be explained in reference to the graph of FIG. 2 displaying the flow of reactants and a carrier ballast gas as a function of time. Flow of a first reactant gas is illustrated by a curve 10, and a second reactant gas by curve 12. The flow of a ballast/carrier gas is represented by curve 14, and the total gas flow by curve 16. The method of atomic layer processing gas flow is further described in reference to the flow chart of FIG. 3, describing the flow illustrated in FIG. 2. The carrier gas represented by line 14 (FIG. 2) is injected and maintained at a continuous flow rate (block 18). A first reactant gas (line 10, FIG. 2) is then injected according to a predetermined flow modulation contour for a first period of time represented as item 20 in FIG. 2, and as indicated in block 22. The modulation contour shown in FIGS. 2 and 4 is a trapezoidal shape. The present invention also includes other contours, such as sinusoidal, etc. When the first reactant flow has been reduced to level 24 as noted in block 26, a second reactant is introduced as represented by line 12 in FIG. 2 for a second period of time 28 (FIG. 2), as indicated in block 30 of FIG. 3.

At the expiration of the second period 28, the second reactant is stopped or minimized (block 32) and the first reactant is increased again. The second reactant may be stopped rather than minimized if reactant 2 has a gaseous source and on/off control of reactant 2 is straightforward. The repetition of this cycle shown in FIG. 2 is represented by return line 34 in FIG. 3. The method illustrated in FIGS. 2 and 3 is significantly different from the prior art methods as illustrated generally in FIG. 1 wherein a distinct separation is made between the injection of first and second reactants. Prior art methods inject a purge gas to flush out a reactant gas during this separation in time and/or to evacuate the reaction chamber to remove a reactant gas. FIG. 4 shows an alternate embodiment of the method of the present invention wherein the total gas flow 42 is held more constant than in FIG. 2 by increasing the carrier gas as indicated by the peaked area 36 of the carrier gas line 38 coinciding with dip 40 in reactant gas flow 41 during the process of changing from the first reactant gas 41 to the second reactant gas 43. The method of the present invention differs from the prior art methods in that no purge or evacuation step is used. An advantage of the method of FIGS. 2-4 is that for an ALD cycle of a specified duration, the effective exposure dose of each reactant is increased since it is not necessary to wait for purging or evacuation. Alternatively, the exposure time for each reactant can be decreased which reduces the time required to deposit a quantity of atomic layers.

The method of the present invention as illustrated in FIGS. 2, 3 and 4 describes modulating the gas flow from a first to a second reactant. The present invention also includes any number of reactants, modulating for example from a first to a second, and then to a third reactant, etc.

Figure 5:
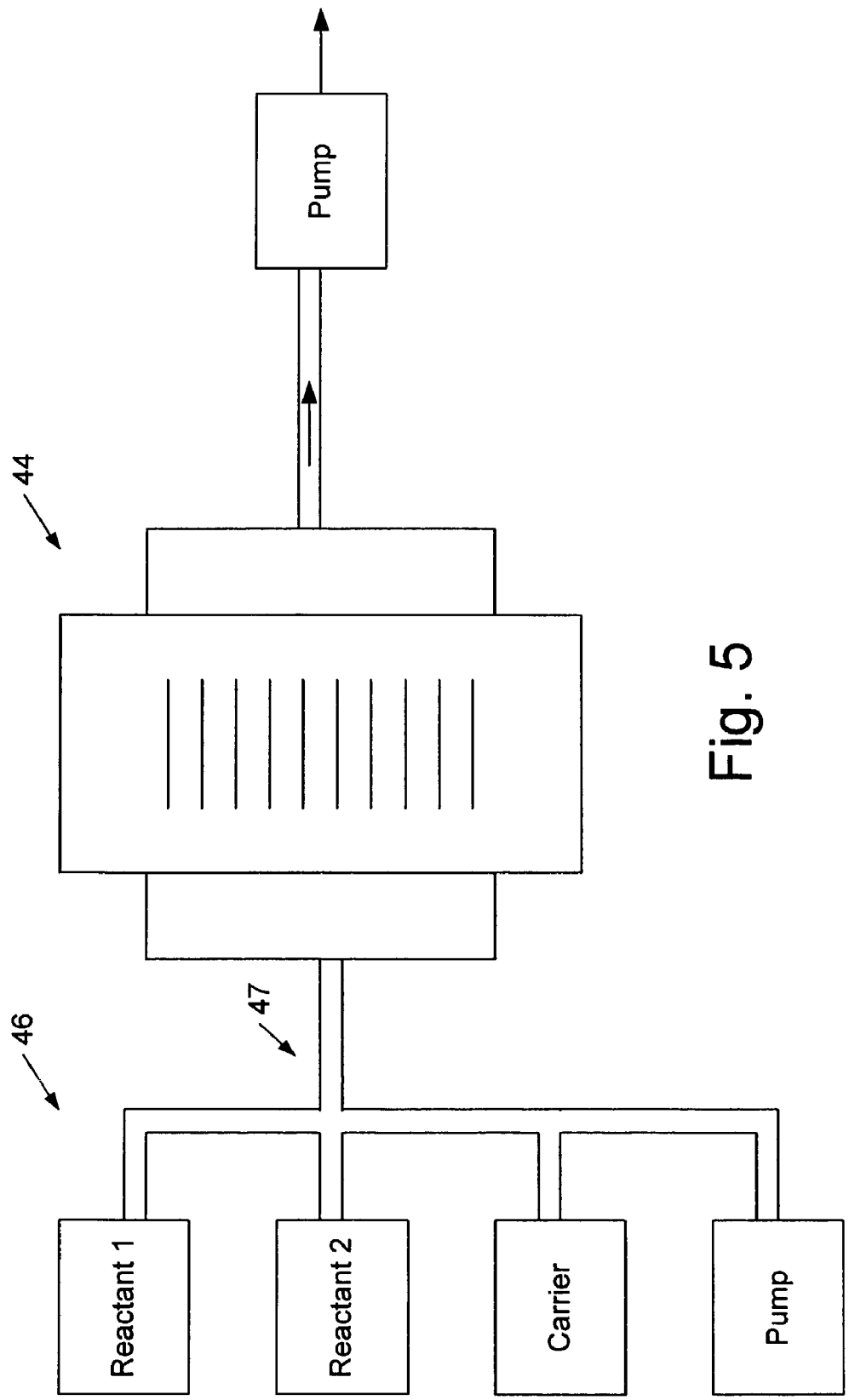
FIG. 5 illustrates an ALP gas injector in combination with a multiple wafer reactor.
Figure 8:
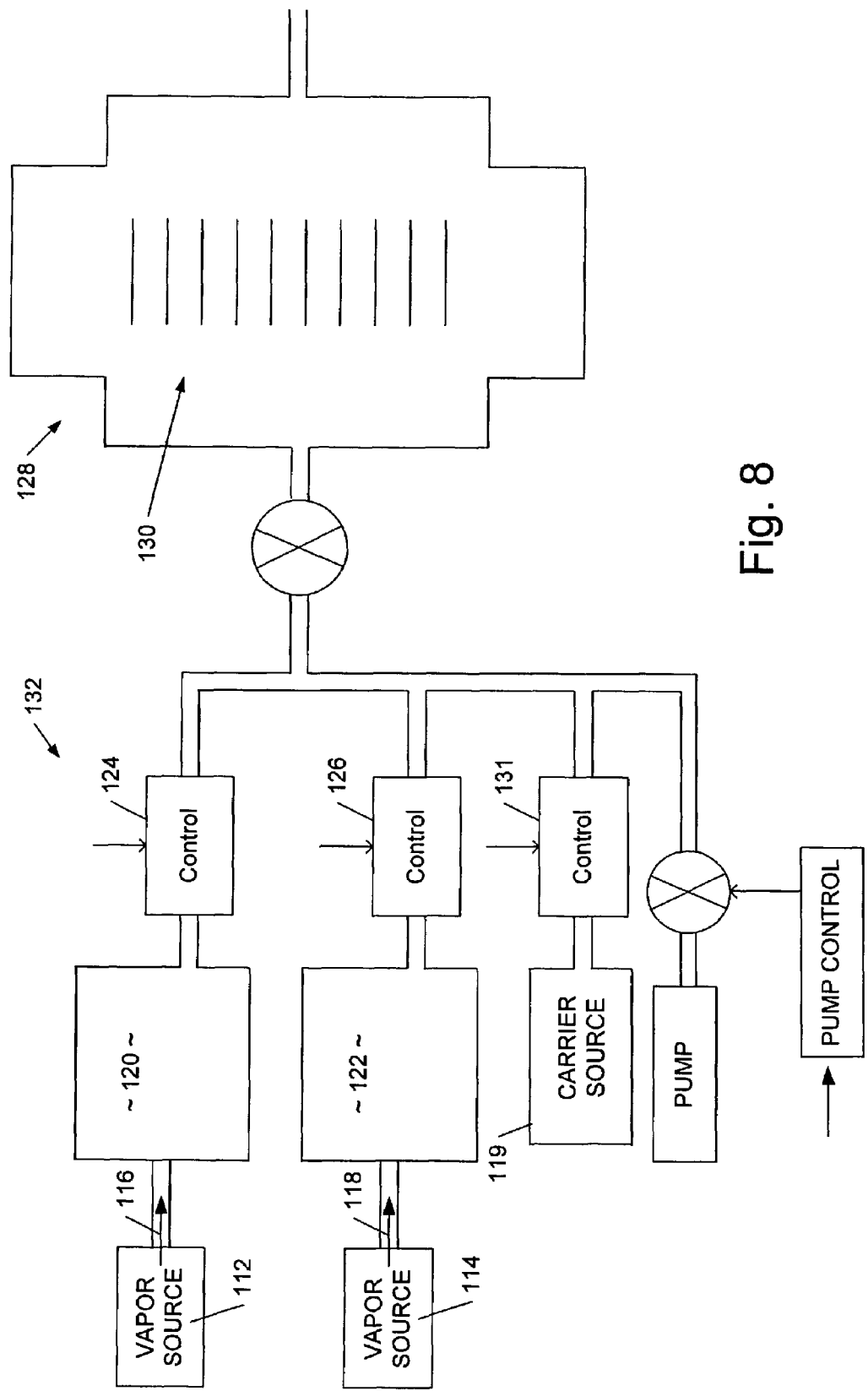
FIG. 8 illustrates a gas delivery system with reactant reservoirs of the present invention in combination with a multi-wafer reactor.

The method of continuous modulation of reactant flow from one reactant to another as described above in references to FIGS. 2-4, provides for a substantial increase in substrate/wafer throughput in an ALP system. The present invention also includes the method as described in reference to FIGS. 2, 3 and 4 in combination with additional method elements and apparatus FIG. 5 shows a combination of a reactor 44 and gas injection apparatus 46 for the ALP method operating as described above in reference to FIGS. 2-4. In this figure, both reactants enter the reactor through a common gas injector port 47. It may be advantageous to inject the two reactants through separate gas injectors such as through a multi-plenum injector in order to improve spatial separation between the reactants. A multi-plenum injector is described in pending U.S. patent application Ser. No. 10/216,079, the contents of which are incorporated in the present disclosure by reference. The reactor 44 is described in detail in U.S. Pat. No. 6,352,593, the contents of which are incorporated in the present disclosure by reference. The simultaneous processing of multiple wafers in the reactor 44 provides a significant increase in wafer throughput. As an alternate embodiment, the method and apparatus of the present invention includes a reactant reservoir for providing an increased supply of reactant. A still further alternate embodiment includes a method and apparatus for providing a rapid thermal anneal after each of a predetermined number of cycles. The rapid thermal anneal improves the film quality at the high wafer throughput provided by the method and apparatus of the present invention. The reactant reservoir is illustrated in FIG. 8 as applied to ALP with a multiwafer reactor. The reservoir can also be used with a single wafer reactor according to the present invention. The rapid thermal anneal is described in block 48 of FIG. 3 illustrated as an alternate embodiment indicated by dashed lines 49. A detailed description of the method and apparatus for the modulated gas flow, ALP multiple wafer reactor, reactant reservoir and rapid thermal anneal will be provided in the following text and figures of the specification.

The modulation of flow and pressure as described in reference to FIGS. 2-4 will now be described in more detail. As explained above, the pump-purge steps as practiced in prior art ALP have been eliminated. Instead, the reactant flows and pressures are cyclically modulated from one reactant directly to another. As shown by item number 24 in FIG. 2, the flow and pressure of a reactant is dropped to an arbitrarily low value, rather than a complete turn-off. As described before, the allowable residual level of one precursor when the other is introduced is process dependent. One criterion for determining the allowable residual level of one precursor is the contribution of parasitic CVD to the overall deposition rate. For an ALP process, the contribution of the parasitic CVD to the overall deposition rate should typically be less than 10%, although higher values may be tolerable if the film properties, film uniformity and step coverage do not suffer. In fact, parasitic CVD may be used to enhance the deposition rate of the otherwise slow ALP processes. This is termed molecular CVD. Molecular CVD enhances the deposition rate compared to ALP, but still achieves relatively good step coverage, film uniformity and good film properties. For some processes, the contribution of CVD to the overall deposition rate must be <1% to avoid particulate generation gas phase reactions. Also, perfect isolation of the precursors from each other during ALP is not required and in some cases may also be undesirable. Some parasitic CVD can prevent adverse reverse reactions from occurring that would otherwise etch the film being deposited. According to the present invention, it has been discovered that the discrete purge steps in conventional prior art ALP have no process benefit and only serve to isolate the reactants from each other, an assumption made and held to rigorously in prior art systems. A variety of flow and pressure modulation waveforms (e.g. square, triangular, trapezoidal, sinusoidal, exponential, etc.) can be used independently or in combination. A trapezoid waveform according to the present invention is shown in FIGS. 2 and 4. As described above, a carrier gas flow is represented by lines 14 and 38 in FIGS. 2 and 4 respectively, and is generally necessary to shorten the gas flow transit time from a reactant delivery system to a reactor chamber. The carrier gas flow rate also controls the residence time, of the reactant in the chamber. In addition, carrier gases dilute the precursor, reducing the chances for condensation in the delivery line. In the method illustrated in FIG. 2, when the reactant flow transitions from one reactant to another reactant, the total flow rate through the chamber drops. Increasing the carrier gas flow during this transition to act as gas ballast can compensate for this drop resulting in a more constant total flow rate. This further improvement to the ALP protocol is shown in FIG. 4 as item 36.

Figure 1:
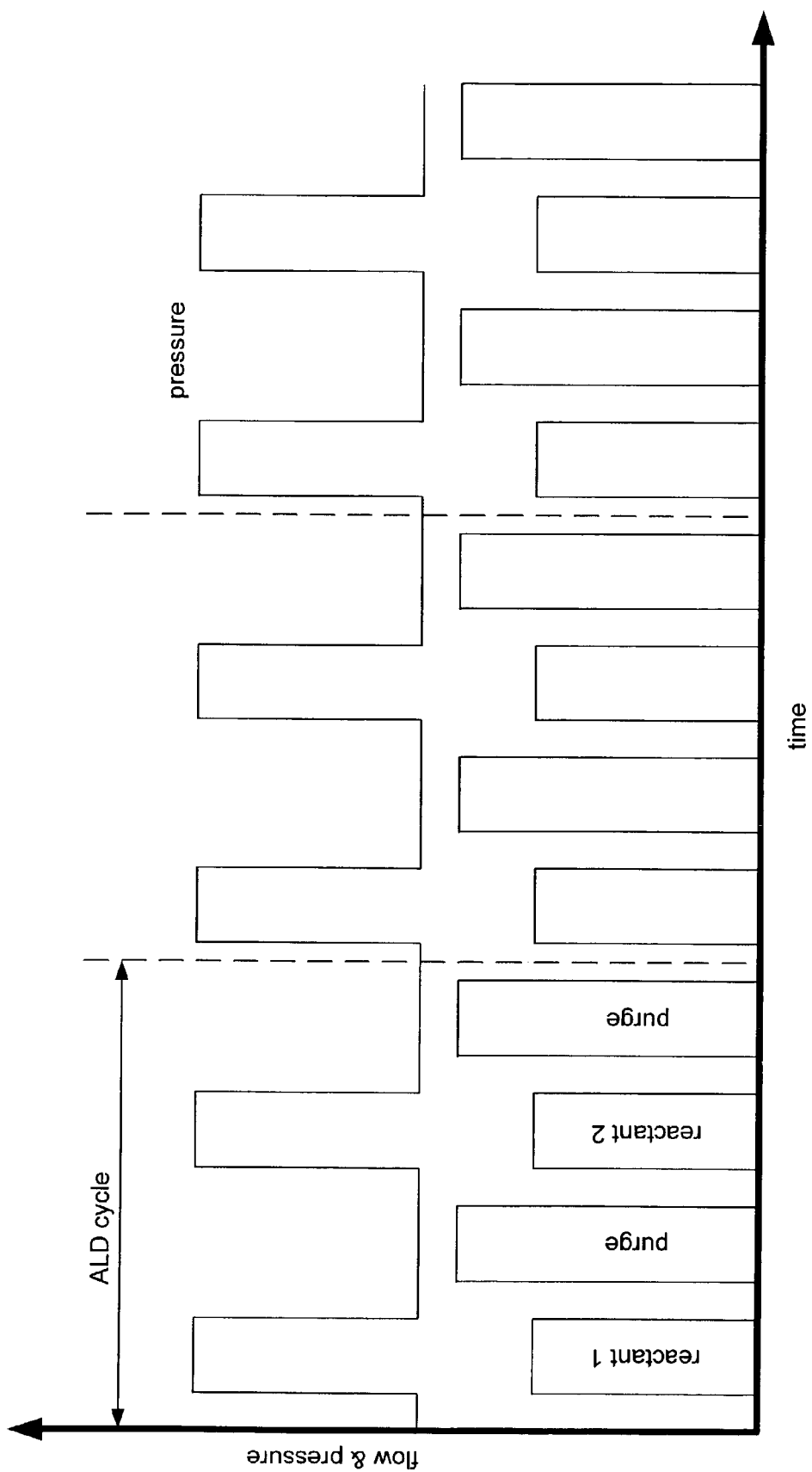
FIG. 1 shows a prior art ALP sequence.

In the prior art ALP sequence shown in FIG. 1, discrete reactant pulsing and pump/purge steps are included. The ALP protocol of the present invention offers several advantages over the prior art discrete pulsing of reactants and inert purge gases. The prior art systems require a gas delivery system with diverter lines for diverting reactant flow to a foreline of a pump when the particular reactant is not being sent to a reactant chamber. The present invention eliminates the need for the diverter lines and therefore avoids the problem of reactant mixing in a pump foreline. This will be more fully described in the following text of the specification. Another advantage of the present invention is that the need for rapid cycling of valves and flow control components of the prior art is eliminated because the time scales over which the flow is modulated are long compared to the prior art ALP cycle. This makes the ALP protocol compatible with a variety of reactant sources including sublimed solids, liquids and remote plasmas. In prior art systems, reactant pulse and purge times could be as short as 0.5-1 s in order to shorten the duration of an ALP cycle. Through continuous flow modulation, the reactant pulse time can be doubled without increasing the overall duration of an ALP cycle.

In the prior art, the rapid cycling of gas components and gas valves can result in pressure bursts. Pressure bursts typically loosen weakly adhered particles into the gas stream, thereby contaminating the wafer. The smooth flow modulation of the present invention eliminates, or at least minimizes pressure bursts. The prior art rapid cycling of gas valves can also increase considerable particulate generation within the valves, especially for valves exposed to reactants that are highly reactive or possess low vapor pressures. The method of flow modulation of the present invention also permits an arbitrarily low reactant concentration to be maintained during all portions of the cycle to minimize undesirable reverse reactions. In FIGS. 2 and 4, a low residual flow of reactant 1 is present at all times in the cycle. In most instances, a low residual level of reactant 2 while reactant 1 is flowing is also permissible.

In the method of the present invention, the effective exposure time of a wafer surface to the reactants increases without increasing the duration of the ALP cycle. This can be seen by comparing FIGS. 1 and 2. For an ALP cycle with a fixed duration, the effective exposure time of the wafer surface to either reactant in FIG. 2 is double the value in FIG. 1 since the discrete inert gas purging steps have been eliminated. The discrete evacuation and inert gas purging steps of the prior art that only add overhead to the process time have been eliminated.

Figure 6A:
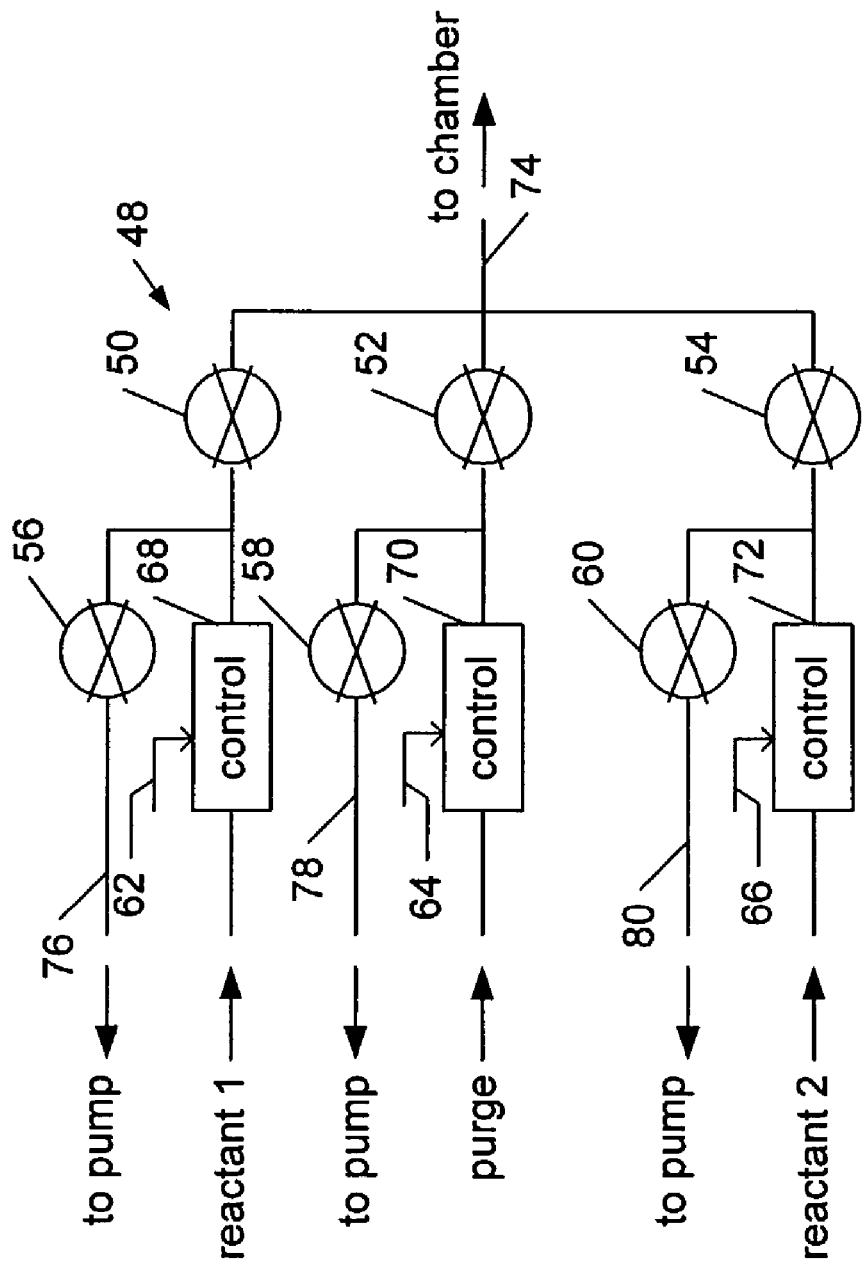
FIG. 6A illustrates a prior art gas delivery system.
Figure 7A:
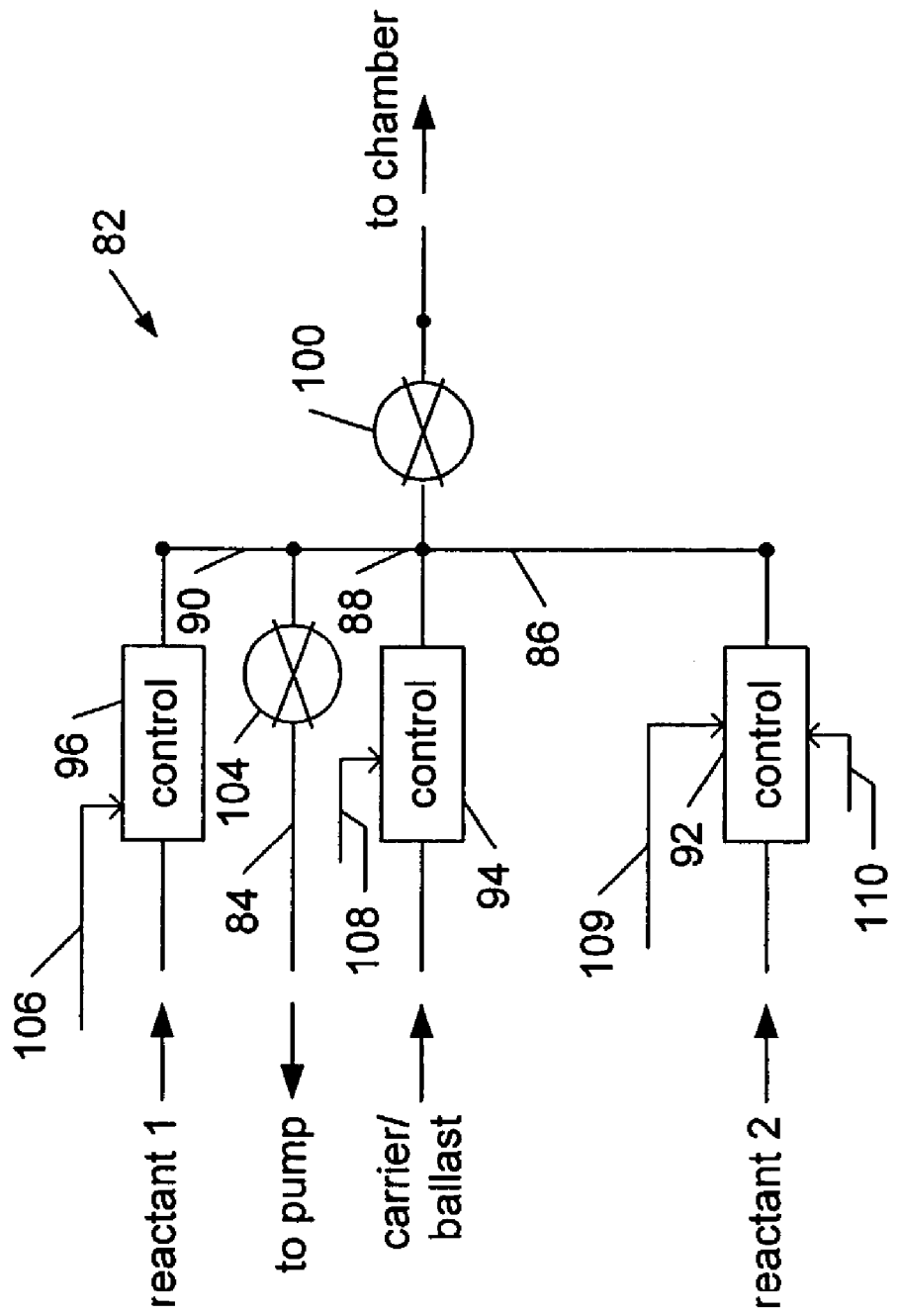
FIG. 7A illustrates a gas delivery system according to the present invention.

FIG. 6A is a simplified schematic of a prior art reactant gas delivery system, and FIG. 7A is a simplified schematic of a reactant gas delivery system according to the present invention. Only the essential components are shown. Actual systems typically include more components such as additional valves, filters, etc. in order to make the delivery system more robust and maintainable. The boxes marked "control" are the flow controllers. Types of controllers include a mass flow controller used for high-pressure gaseous sources, a pressure based flow controller used for low vapor pressure gaseous sources, and a combination liquid mass flow controller and vaporizer used for liquid sources. A combination mass flow controller, bubbler and temperature controller may be used for solid and liquid sources. The prior art system 48 of FIG. 6A provides alternating pulses of reactant and inert purge gases. Typically the delivery valves 50, 52, 54 and the diverter valves 56, 58, 60 are toggled on/off to deliver pulses of reactant to the reactor while control signals at 62, 64, 66 to the controllers 68, 70, 72 remain at their set-point values. The delivery valves 50, 52, 54 are shown in-line with the main flow path 74, and the diverter valves 56, 58, 60 are installed in-line with diverter lines 76, 78, 80 that are connected to the foreline of a pump (not shown).

FIG. 7A shows a reactant delivery system 82 for the improved ALP protocol of the present invention that uses continuously modulated flow and pressure signals rather than on/off signals. Notice that the diverter lines 76, 78, 80 of FIG. 6 have been eliminated, except for a single diverter line 84 that may be used to evacuate the gas delivery lines 86, 88, 90 downstream of the flow controllers 92, 94, 96. Here the diverter line 84 is used as a pump out line rather than a diverter line in the traditional sense. The operation of this system is quite different from the system shown in FIG. 6A. During the process, the delivery valve 100 may remain open and the diverter valve 104 remains closed. Thus rapid cycling of valves between the on/off states is avoided. A pre-specified waveform is supplied to each of flow controllers 92, 94, 96 so that the reactant and carrier/ballast flows shown in FIG. 2 can be achieved. In fact the control signals at 106, 108 and 109 directing controllers 92, 94, 96 can be provided directly to the control valve of each flow controller for an even faster response. Mass flow controllers incorporate an internal flow sensing device and PID control loop that modulate the position of the internal control valve to achieve the desired flow in response to the externally provided flow set-point. Since the response time of the internal flow sensor is typically 1-2 s, the, mass flow controller cannot respond to set-point changes over time scales shorter than a few seconds. For continuous flow modulation, the response time of the mass flow controller must be decreased. Rather than providing a continuously changing set-point to the mass flow controller, a slowly varying signal may be applied directly to the internal control valve to modulate the flow. In this manner, the intrinsically slow response time of a mass flow controller can be overcome. In this manner the architecture and operation of the reactant delivery system are considerably simplified compared, to the delivery system for the prior art ALP sequence. A more detailed description of the prior art four step ALP sequence using the system of FIG. 6A is given in blocks 59-65 of the flow chart at FIG. 6B. These steps are repeated multiple times to deposit the desired film thickness as indicated by the return line 67.

Figure 6B:
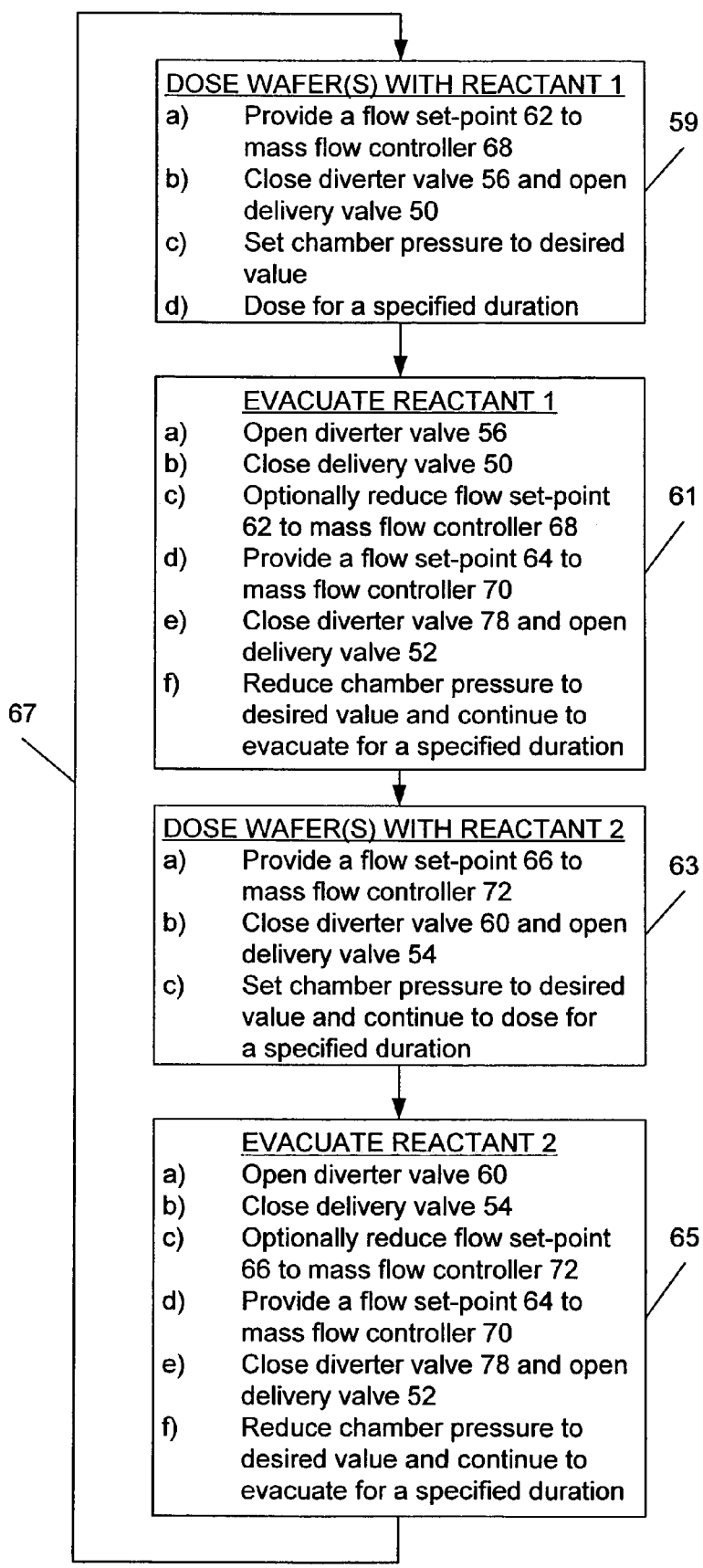
FIG. 6B is a flow chart of the ALP operation of the system of FIG. 6A.
Figure 7B:
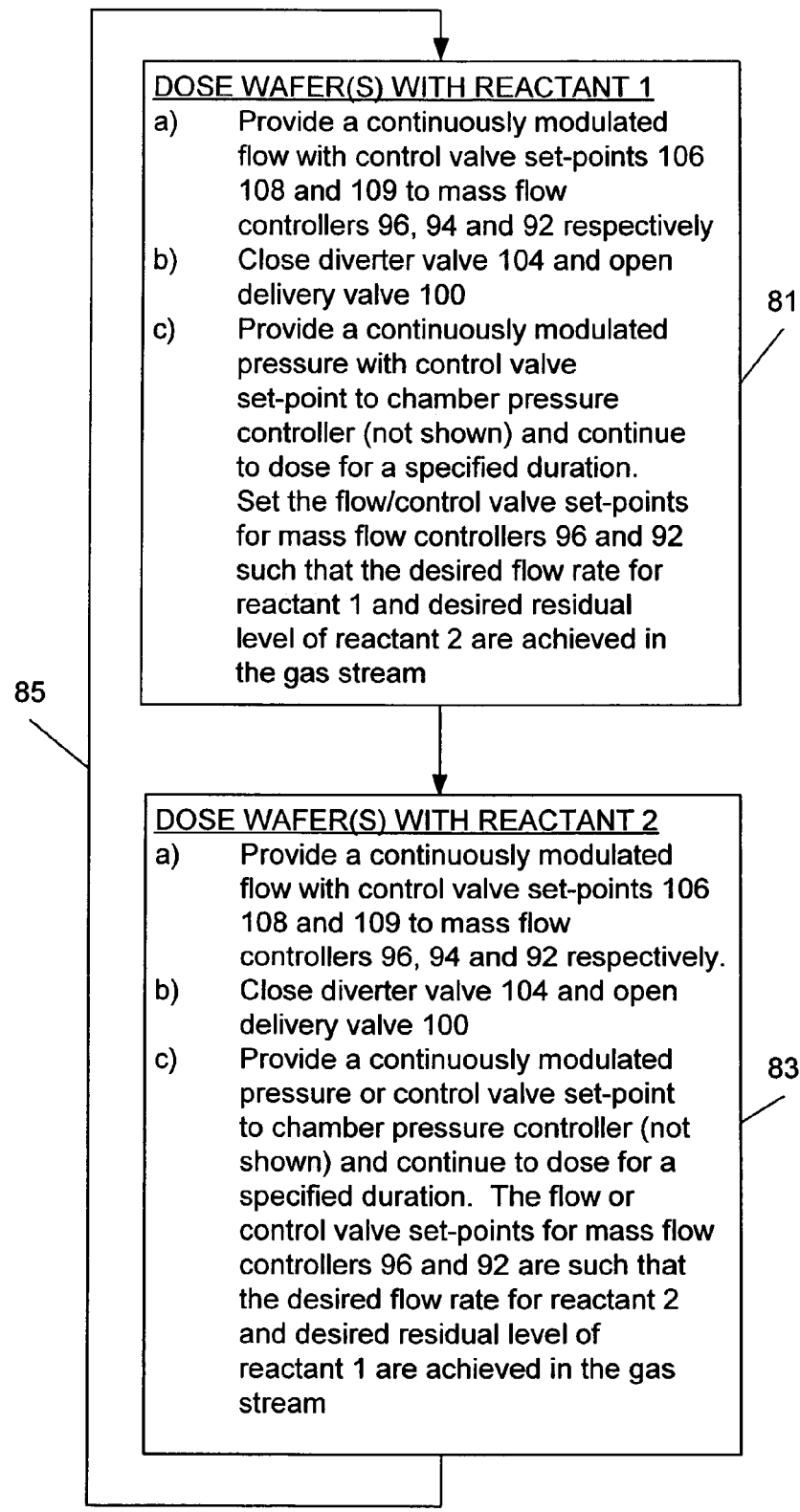
FIG. 7B is a flow chart of the operation of the apparatus of FIG. 7A.

In contrast to FIG. 6B, the ALP sequence in accordance with the present invention using apparatus as illustrated in FIG. 7A consists of only two steps with reduced on/off switching of components as described in blocks 81 and 83 of FIG. 7B. The steps are repeated to achieve the desired film thickness as indicated by return line 85.

Figure 7C:
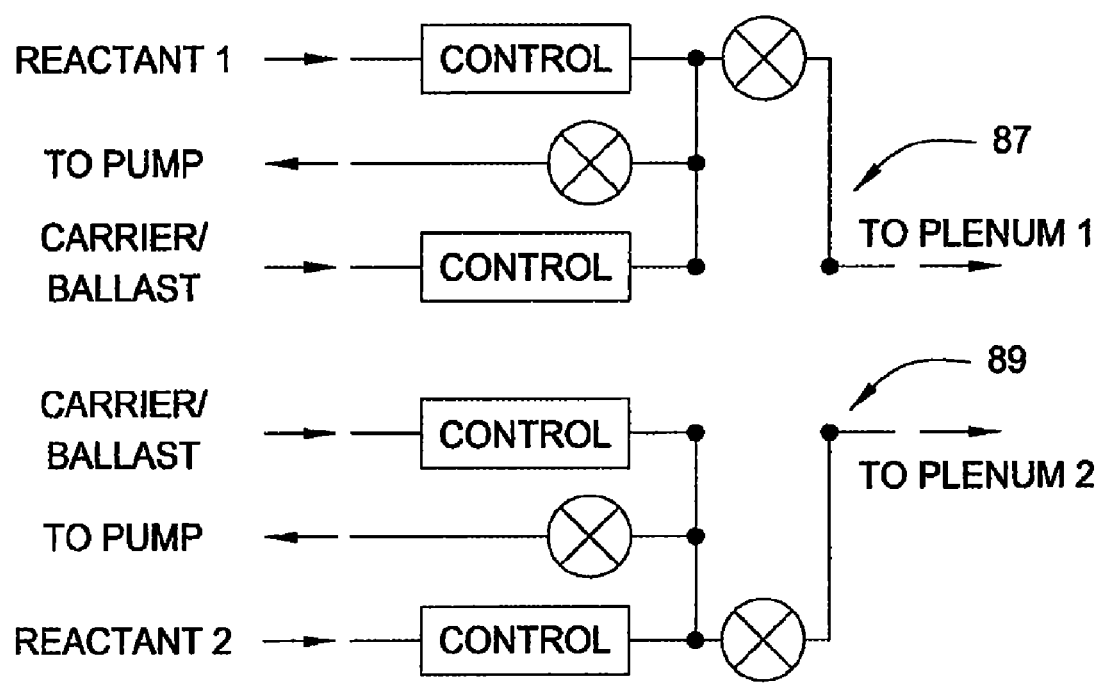
FIG. 7C shows a version of the delivery system of FIG. 7A but adapted to a multi-plenum injector.

A version of the delivery system shown in FIG. 7A but adapted to a multi-plenum injector is shown in FIG. 7C. Reactant 1 and reactant 2 of the embodiment of FIG. 7C are output from the system of FIG. 7C through separate outputs 87 and 89 for input to a chamber through separate plenums 1 and 2 (not shown) introduced into a chamber through separate injectors.

Another alternative reactant delivery system that uses a reactant reservoir is shown in FIG. 8. First and second reactant sources 112 and 114 provide vapor 116, 118 to charge reservoirs 120 and 122 when corresponding control valves 124 and 126 are not providing flow to reactor 128 as fast as sources 112 and 114 create reactant vapor. As explained above, controllers 124 and 126 do not completely shut off the reactants as in prior art systems. According to the method of FIGS. 2 and 4, the reactant reservoir supplies reactant-vapor to the chamber 130 according to the degree of controller/valve opening provided by the controllers 124, 126. The carrier source controller 131 may also be modulated to maintain a more constant gas flow as described above in reference to FIG. 4. As the reactant flows from the reservoir into the chamber, the reservoir is depleted thereby decreasing the upstream gas pressure. Controllers 124 and 126 must compensate for this reduction in upstream pressure to achieve the desired reactant flow rates into the chamber. In an ALP cycle, only one reactant is flowing at a substantial rate, while the second reactant is flowing into the chamber at a greatly reduced flow rate. When the flow rate of one reactant into the chamber is reduced, the corresponding reactant reservoir is replenished. The capacity of the reactant reservoir should be chosen so that it holds sufficient reactant for the reactant dosing step.

The reactant reservoir provides a larger supply of reactant than prior art systems. Frequently, in prior art systems, the maximum reactant flow that can be delivered to the chamber is constrained by the nature of the reactant. This is especially true of liquid or solid reactant sources that usually have a low vapor pressure and are not readily volatilized. For example, consider a reactant in, a prior art system that can be delivered at a maximum flow rate of 10 sccm because the vaporizer can only volatilize 10 sccm of the reactant. In this scenario, the time required to fill a 1 liter reactor chamber to 1 Torr with this reactant is ~8 s. In comparison, if for example a reactant reservoir of the present invention is charged with 10 Torr-1 of reactant vapor (e.g. 4 liter reservoir charged to 1.5 Torr), a 1 liter reactor chamber is filled to 1 Torr almost instantaneously when the reservoir is discharged into the chamber. This improvement is particularly advantageous for the parallel wafer processing reactor whose chamber volume exceeds that of a single wafer chamber by approximately an order of magnitude. In the absence of a reactant reservoir, the reactant flow from the reactant sources would have to be an order of magnitude higher compared to the values for a single wafer ALP reactor. A reactant reservoir obviates the requirement for these high reactant flows from the reactant source. Without a reactant reservoir or some other method of accommodating the evaporated reactant vapor, the downstream pressure would reach an unacceptably high level if the delivery valve is closed. FIG. 6A of the prior art shows diverter valves 56-60 and lines 76-80 to divert excess vapor to a pump or i.e. foreline of a pump, when the corresponding delivery valves 50-54 for each gas are shut. Referring again to FIG. 8 of the present invention, instead of diverting the flow into a foreline, the flow is accumulated in a reactant reservoir, thereby charging the reactant reservoir. In a typical prior art ALP sequence consisting of four steps, the reactant flows into the chamber during ~25% of the ALP cycle. Because of this, during 75% of the ALP cycle the reactant is diverted into the foreline of the pump and is essentially wasted. Diverting the precursor into the foreline could have some unforeseen consequences such as particle generation. In a conventional ALP sequence, when one reactant is being diverted, the other is being introduced into the chamber and thence into the foreline. Thus the two reactants mix in the foreline of the pump, which can generate particles. With the reactant reservoir of the present invention, the reactant is either flowing into the chamber 130 or is accumulating in the reactant reservoir. The contents of the reactant reservoir are periodically discharged into the reactor chamber 130, releasing the pressure in the reservoir. In this manner, reactant wastage is reduced, and particle generation in the foreline of the pump is avoided.

Figure 9:
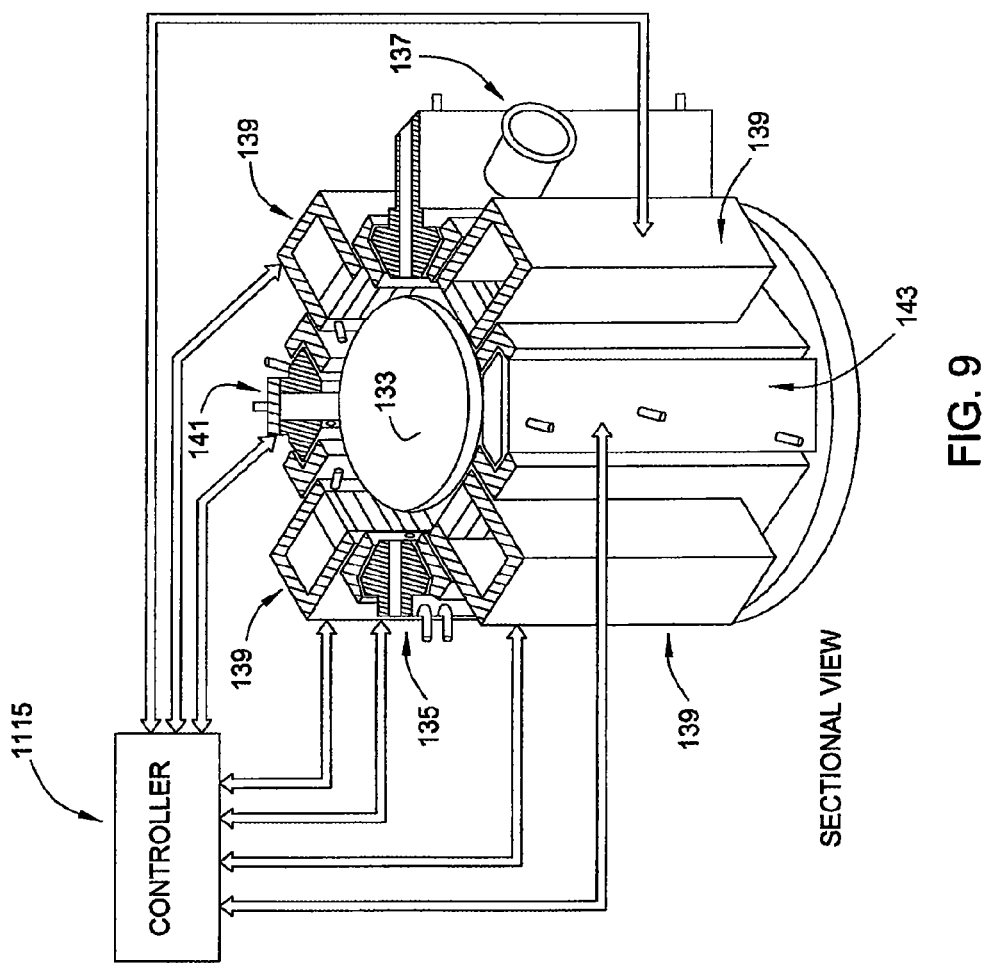
FIG. 9 is a perspective view of a multiple wafer reactor.

A preferred embodiment of the multiple wafer reactor 128 of FIG. 8 for use in ALP processing is shown in FIG. 9 In a cross-sectioned view showing interior parts. This reactor is described in detail in reference to FIGS. 27 and 28 of pending U.S. patent Ser. No. 10/216,079, the entire contents of which are included in the present disclosure by reference. The chamber of the multi-wafer reactor of FIG. 9 is designed for a reduced size volume that is compatible with the requirements of a successful ALP cycle. Very generally, the reactor of FIG. 9 includes a multi-water boat 133, a gas input 135, an exhaust 137, heaters 139 and two additional ports 141, 143 which can be used as a cleaning injector port and thermocouple port. Each heater and port is controlled in temperature by a controller 145. The arrangement of the reactor of FIG. 9 minimizes chamber interior volume, which is an important feature as discussed above in order to allow adequate control of gas flow.

The gas delivery system, such as system 132 in FIG. 8, has to be designed to support a particular application. The components in the gas delivery system are application dependent. FIG. 8 shows two reactant sources 112 and 114 and one carrier source 119, but the present invention includes any number as required for deposition of a particular film. For example, in order to deposit nanolaminates of $AlO_x/HfO_x$ films, the delivery system includes one, or more liquid reactant sources (e.g. trimethylaluminum, Hf-t-butoxide, and water), one or more gaseous reactants (e.g. oxygen, ozone, nitrous oxide, ammonia, etc.), and radical sources (e.g. hydrogen, oxygen, or nitrous oxide remote plasma with or without a carrier such as Ar). The gas delivery system is located so that a short reactant gas transit time of below 2 s from each reactant source to the reactant chamber can be achieved. The reactor of FIG. 9 can be used with a prior art gas delivery system as described in the above description in reference to FIG. 6A, and this combination is believed to be novel, and provides an improvement in ALP processing speed. The reactor of FIG. 9 can also be used in conjunction with the reactant reservoir shown in FIG. 8., More preferably, the reactor of FIG. 9 can be used with a gas delivery system according to the present invention providing the modulated gas flow described in reference to FIGS. 2-4. The structure of the improved delivery system can be as described in reference to FIG. 7, and still further can include the reactant reservoirs as described in reference to FIG. 8.

The chamber of FIG. 9 is described in detail in reference to the figures of pending U.S. patent Ser. No. 10/216,079. Incorporation of the chamber of FIG. 9 in ALP processing according to the present invention is an improvement over the prior art because a low chamber volume allows improved control of reactant flow and therefore allows more rapid changes in reactants in the chamber, minimizing the ALP cycle and maximizing the utilization of the reactants. The effective chamber volume per wafer is reduced in the chamber of FIG. 9 by decreasing the inter-wafer spacing and the gap between the boat and the surrounding chamber surfaces. The gas injector port, exhaust port, cleaning injector port and thermocouple port constitute the surrounding chamber surfaces. Alternatively, the reactor of FIG. 9 can include heat shields, spaced dose to the boat, as also described in pending U.S. patent Ser. No. 10/216,079. ALP processing temperatures are typically in the range of 300-550° C., and thus the gap between the boat and the surrounding chamber surfaces can be reduced without overheating the injector port, exhaust port, clean injector port and thermocouple port that are temperature controlled as explained in pending U.S. patent Ser. No. 10/216,079. In this manner, the extraneous volume per wafer can be reduced to 25% of the inter-wafer volume for each wafer pair. With these improvements, a typical ALP cycle of 20-30 s can easily be attained, which translates to a deposition rate of 2-3 Å/min. The parallel wafer processor/reactor with the improved modulated flow of the present invention can process up to 25 wafers at a time. The process generally involves 10 minutes overhead for wafer loading/unloading, and 10 minutes overhead for stabilizing wafer temperature. The total duration is therefore the processing time plus an overhead of 20 min. With 20 min overhead, throughput for 30 Å films is approximately 40 wafers per hour (wph), while the throughput for 100 Å films is 20 wph. Contrast this with throughputs of 10 wph for 30 Å films and 4 wph for 100 Å films deposited using a prior art single wafer ALP. A 5× improvement in throughout can easily be garnered with this approach.

Figure 14:
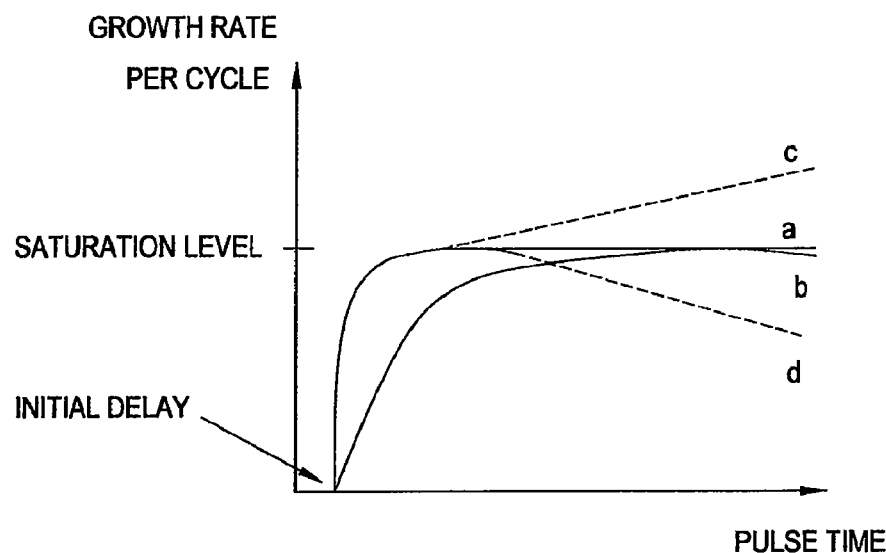
FIG. 14 is a display of surface saturation as a function of pulse time.

For ALP, complete saturation of the wafer surface by each reactant is necessary for good film uniformity, good step coverage and good film properties. The extent of surface saturation depends primarily on the amount of time during which the wafer is exposed to the reactant (pulse time), as shown in FIG. 14. The surface saturation is also affected by the chemistry of the reaction. Some reactants adsorb very rapidly (curve a in FIG. 14). More often, the saturation proceeds slowly (e.g. curve b in FIG. 14). Curve (c) illustrates saturation with a reactant that decomposes with time, and curve (d) illustrates saturation with a reactant that desorbs.

Figure 15B:
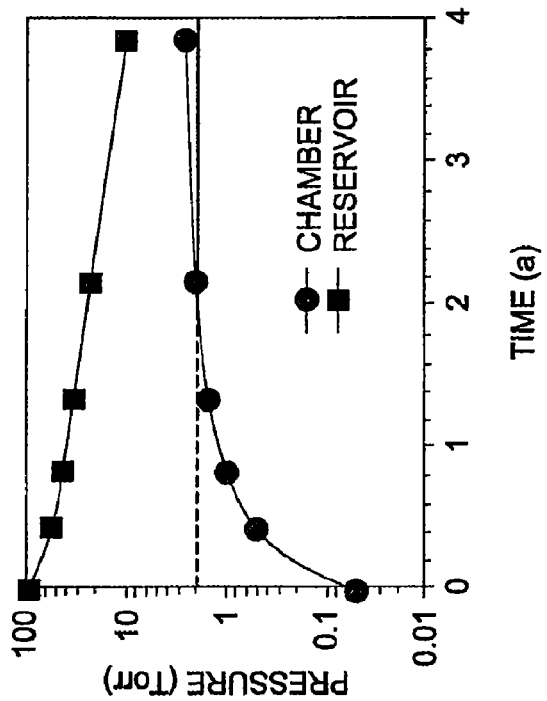
FIG. 15B is a plot of chamber pressure versus time during filling using a reactant reservoir, and a plot of reservoir pressure, versus time.
Figure 15A:
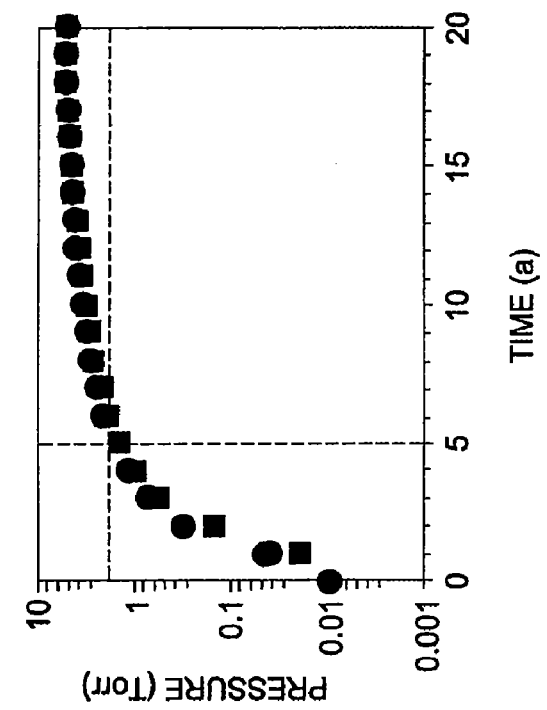
FIG. 15A is a plot of chamber pressure versus time during filling.

In all of the cases, filling the reactor with each reactant as quickly as possible achieves surface saturation in the shortest period of time. If the time to fill the reactor with the reactant is too long, and the reactant has a tendency to either decompose or desorb over a period of time (curves c and d in FIG. 14), ALP is not possible since the reactant would have either decomposed or desorbed before the second reactant is introduced. Long reactor fill times become a serious issue for larger volume chambers. It is vital that the chamber volume be reduced as much as possible. The reactant reservoir partially alleviates the longer fill times required for large volume chambers. FIG. 15A shows the fill time of a 92 liter parallel wafer processing reactor if a steady flow of 1 slm $N_2$ is used. The fill time is ~5 s, defined as the time required to arrive at a desired percentage of the maximum chamber pressure possible with the given supply parameters. If instead a reactant reservoir according to the present invention is used that is charged to 300 Torr-liter (90 Torr×3.5 liters), the fill time for a 160 liter chamber is reduced to <2 s as shown in FIG. 15B. FIG. 15B also shows the reduction in reservoir pressure as the chamber is filled. If the chamber volume is reduced to 45 liters, which is achievable for a parallel wafer processing reactor of FIG. 9 designed to process 25 wafers concurrently, reactor fill times would approach 1 s. Thus a significant shortening of the reactor fill time is achievable through the use of reactant reservoirs.

Figure 16:
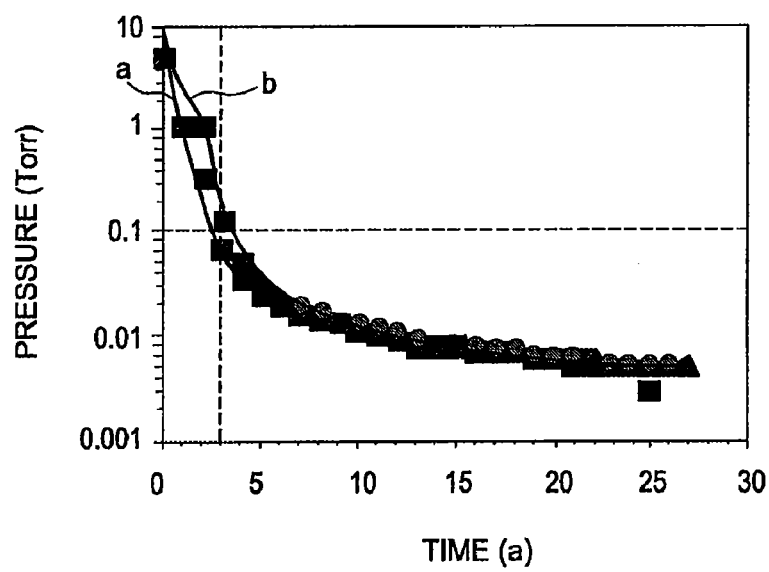
FIG. 16 is a graph with two curves showing the time to exhaust a reactant by pumping (curve a), and pumping and purging (curve b).

Single wafer ALP reactors use a combination of pumping while simultaneously purging to evacuate the reactant from the reactor chamber because it is more time efficient compared to pumping alone. This is because it takes a few seconds to open the chamber pressure control valve (i.e. the throttle valve) from its fully closed position. In comparison, pneumatic valves can be opened and closed in a fraction of a second. However, for the parallel wafer processing reactor shown in FIG. 9 which has a high conductance exhaust port and a substantially larger chamber volume compared to single wafer ALP reactors, pumping alone rather than simultaneously purging can achieve sufficient reactant evacuation in a shorter period of time. FIG. 16 curve "a" shows that the pumping time to reduce the chamber pressure approximately two orders of magnitude lower than the initial pressure is about 2-3 s; the two curves (a and b) represent data from two experimental runs for similar initial and final conditions. FIG. 16 curve "b" shows that it takes significantly longer to achieve the same reduction in partial pressure of the reactant if pumping and purging are simultaneously used.

The objective of the present invention to enhance wafer throughput in atomic layer deposition is further promoted through implementing methods that increase chemisorption rates.

Figure 10:
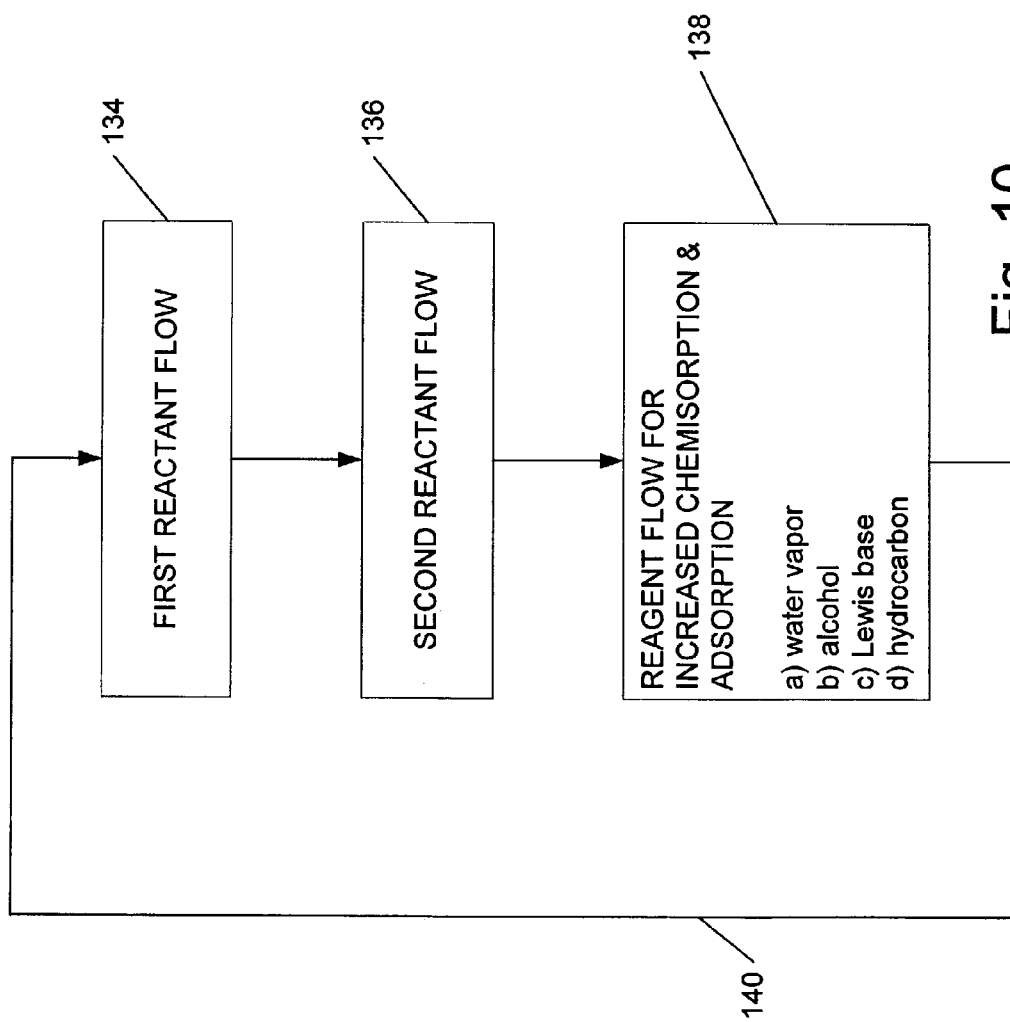
FIG. 10 is a flow chart illustrating use of chemisorption to increase the deposition rate in ALP.

A fundamental lower limit on the reactant pulse times is the reactant exposure dose to achieve complete saturation of the surface at a particular temperature. Typically the temperature is chosen to maximize reactant coverage and ensure that the surface reaction between the chemisorbed reactant and the gas phase reactants goes to completion resulting in stoichiometric films with low impurity contents. For some reactants exposure doses in excess of 100 Torr.s are required for complete saturation, negatively affecting the industrial viability of the process. FIG. 10 illustrates the incorporation of one method for increasing the chemisorption rate in an ALD process. A series of reactants represented by blocks 134 and 136, but which could be of any number as required for a selected deposition, are followed by injecting a reagent into the chamber that reacts with the surface of a wafer being processed (block 138). The cycle is then repeated as indicated by return line 140. The ALP cycle could be started with block 138 to precondition the surface prior to the injection of the first reactant.

Surface chemisorption rates depend on the sticking coefficient of the reactant on the wafer surface. Higher sticking coefficients result in higher chemisorption rates. The surface bonding of the substrate affects the sticking coefficient. Typically hydroxylated (OH) or C—H bonded surfaces improve the sticking coefficient. The surface bonding can be altered to the desired higher reactivity by introducing a reagent as indicated in block 138 during the ALP sequence that reacts with the surface. Examples of reagents for the purpose will be apparent to those skilled in the art after reading the disclosure. For example, water vapor can serve as a reagent to hydroxylate the wafer surface. The process can be used for ALP of SiN since $SiCl_4$ and $Si_2Cl_6$ have low sticking coefficients on SiN surfaces but have substantially higher sticking coefficients on hydroxylated surfaces. Organic reagents such as alcohols, Lewis bases, and hydrocarbons may behave similarly. The reagent choice is dictated by improvement in sticking coefficient, and residual film contamination that is introduced. For example, when $H_2O$ is used to hydroxylate the SiN surface at the termination of each ALP cycle, the oxygen impurity levels in the film are likely to increase.

Figure 11:
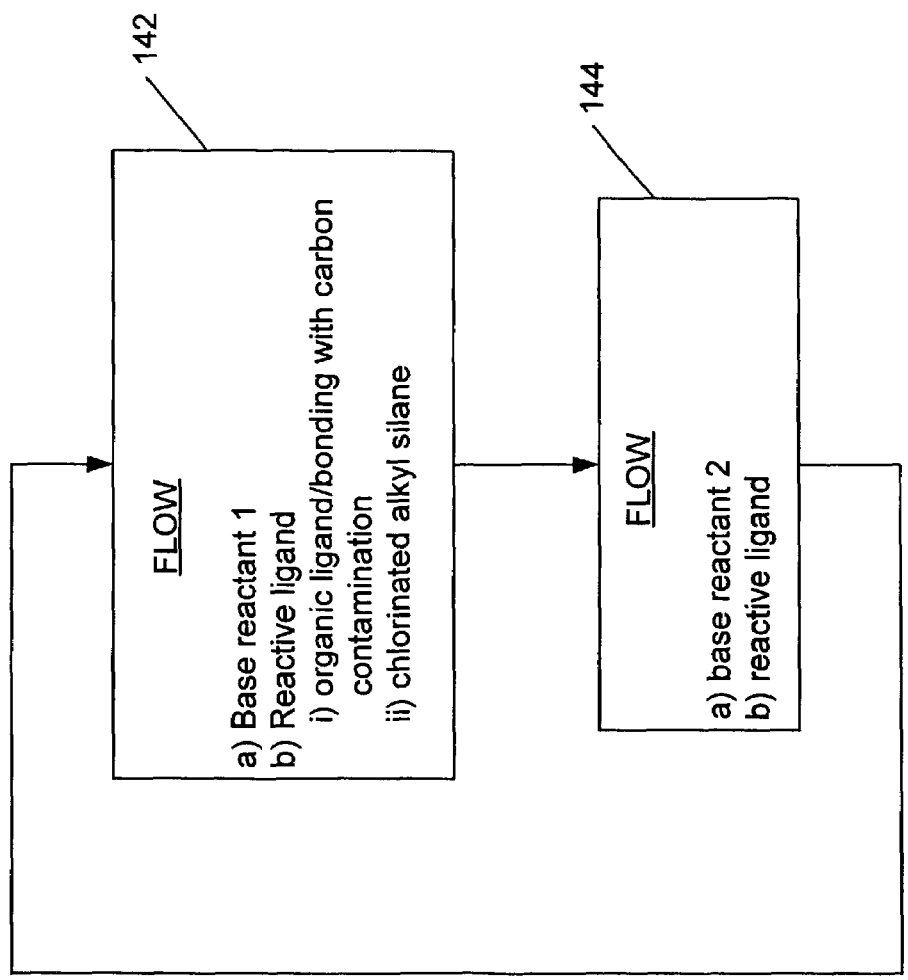
FIG. 11 is a flow chart of an alternate method of increasing deposition using chemisorption.

FIG. 11 illustrates another method of increasing chemisorption in an ALD process. According to FIG. 11, surface chemisorption rates are enhanced by adding a reactive ligand to the base reactant to promote chemisorption (blocks 142 and 144). For example, in the case of ALP SiN using $SiCl_4$, one or more organic ligands are added to the base reactant. The organic ligand bonds with residual carbon contamination in the deposited film and promotes chemisorption. Other substances that can be added to the base reactant include a host of chlorinated alkyl silanes that have higher chemisorption rates than chlorinated silanes, especially on surfaces with trace amounts of incorporated carbon. The trade-off for this approach is similar to the previous approach. Impurity levels in the film are likely to be higher. Trace quantities of certain impurities are acceptable and in some cases enhance the properties of the film. SiN films deposited with an organic precursor that incorporate trace amounts of carbon impurities were found to have a lower electrical leakage compared to films deposited with inorganic reactants that are carbon-free. Another option for chlorinated silicon sources used for ALD of SiN and $SiO_2$ is to replace one or more of the chlorine atoms with a heavier halogen. For example silicon tetrabromide or silicon tetraiodide may be used in conjunction with $NH_3$ to deposit SiN. Both these precursors have lower volatilities and hence higher sticking coefficients to the wafer surface compared to the chlorinated forms. Another advantage of switching from chlorinated silanes to silicon tetrabromide or silicon tetraiodide is that the silicon to halide bond is weaker and thus ALP is possible at lower temperatures. Lower temperatures typically favor higher sticking coefficients which translates to higher surface saturation.

Yet another option for increasing chemisorption is to add a ligand to one of the reagents that intentionally introduces some contamination in the film. This contamination increases the chemisorption rates for the other ligand. For example, nitrogen sources such as alkyl amines, alkyl hydrazines, etc.

leave some C—H contamination in the deposited film that increases the chemisorption rate of the silicon source during ALD SiN.

The method of the present invention is further enhanced by periodically annealing the film during growth. In other words, rather than annealing the film following deposition of the entire film, the present invention provides for annealing the film periodically during growth so that the film is uniformly annealed throughout its thickness. Referring to prior art methods, films deposited via CVD are routinely annealed at temperatures higher than the deposition temperature in a variety of ambients ($N_2$, AR, $H_2$, $O_2$, $N_2O$ and mixtures of these gases) to improve film properties such as density, electrical defect density, insulating characteristics, stress, thermal stability, etc. ALP films are deposited at lower temperatures compared to CVD and can also benefit from annealing. A rapid thermal anneal applied to an ALP process according to the present invention provides for annealing the film periodically; e.g. every 5-50 cycles preferably.

Figure 12:
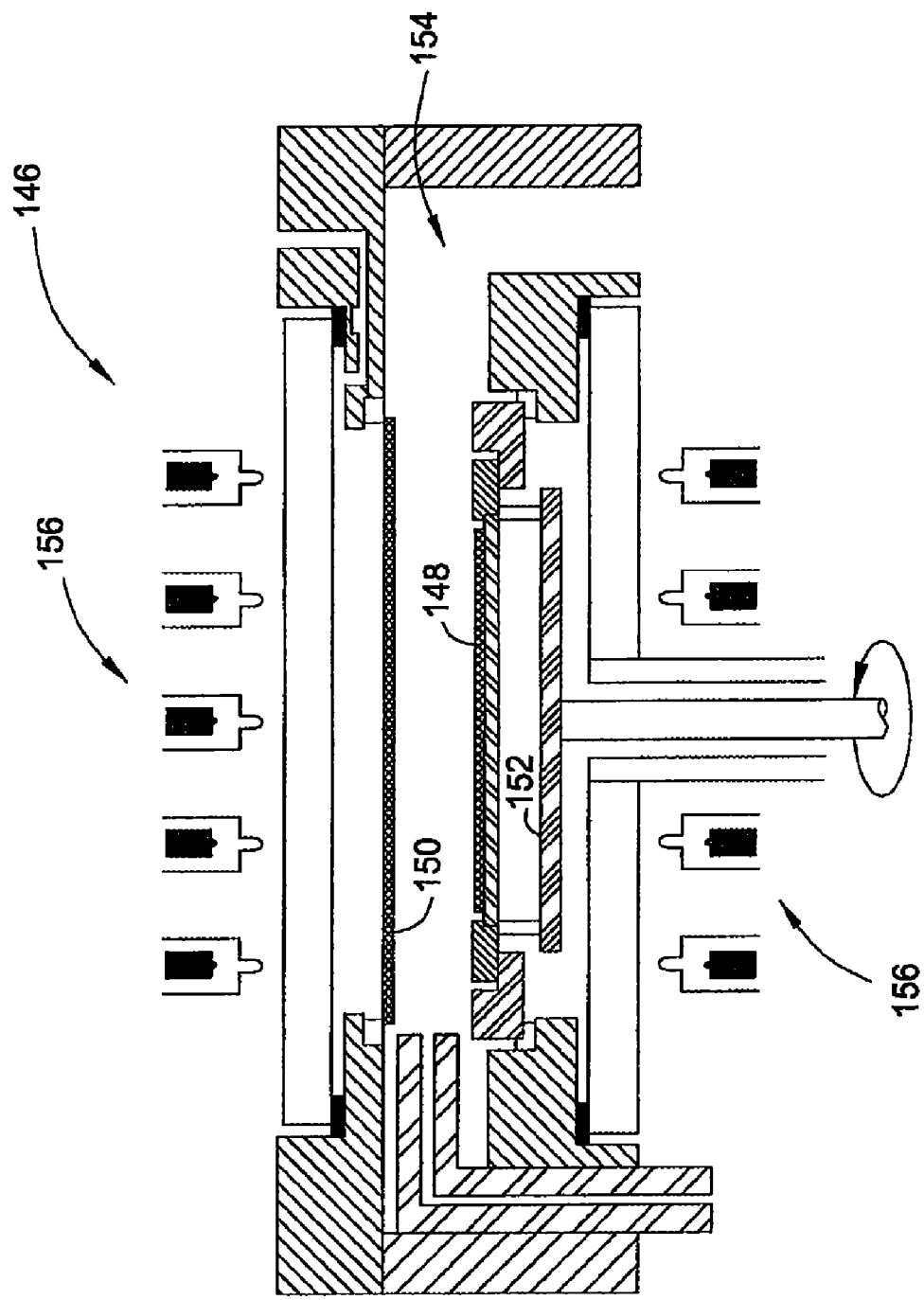
FIG. 12 illustrates a single wafer reactor for ALP.
Figure 13:
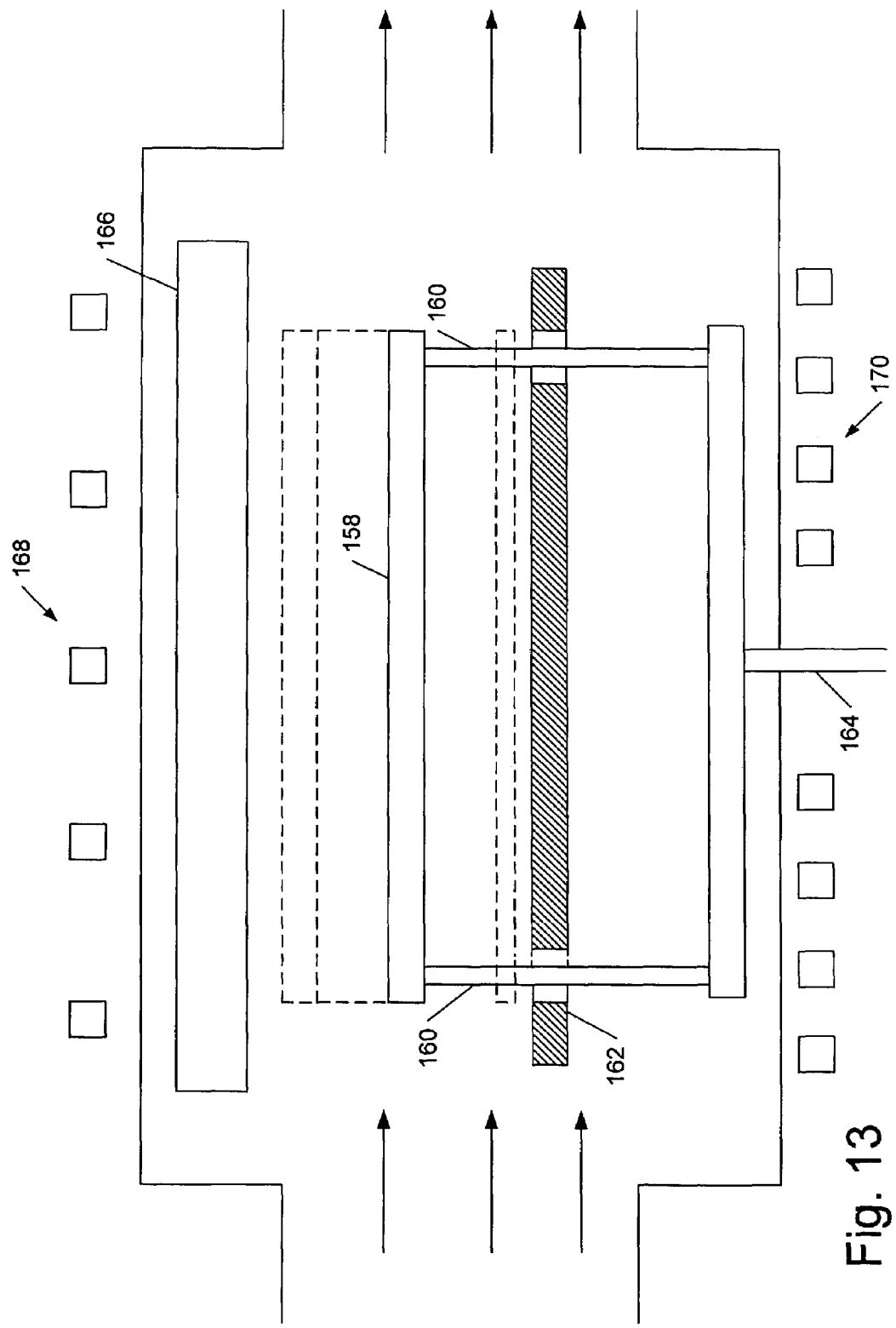
FIG. 13 illustrates an apparatus for rapid thermal anneal.

Apparatus for accomplishing a rapid thermal anneal in an ALP process are illustrated in FIGS. 12 and 13. FIG. 12 shows a single wafer reactor 146. A wafer 148 to be processed is set between an upper susceptor 150 and a lower susceptor 152. The reactor chamber 154 must be minimized in order to be effective in ALP processing. Large chamber volumes generally used in CVD systems are not usable for ALP due to the need for rapid changes in chamber reactants as described above. According to the present invention the ratio of the total chamber gas volume to the volume between the susceptors of the configuration of FIG. 12 or a similar reactor, should be less than 3 and preferably less than 1.5. The multi-wafer chamber described in pending U.S. patent Ser. No. 10/216,079 described above is applicable to ALP and rapid thermal anneal due to the low ratio of total chamber volume in which gas may reside to the volume between susceptors.

In the reactor of FIG. 12, the temperature of the wafer is rapidly raised and lowered by applying more or less heat to the susceptors 150 and 152 from lamps 156. Simultaneously, an annealing gas is injected to anneal the film. A similar reactor is illustrated in FIG. 10 of pending U.S. patent Ser. No. 10/216,079. FIG. 13 illustrates an alternative method of rapidly increasing and decreasing the temperature of a wafer 158. The wafer 158 is supported on pins 160 that pass through clearance holes in the bottom susceptor 162. Apparatus 164 is designed to raise and lower the wafer 158. A top susceptor 166 is heated to a first temperature by heaters 168, and the bottom susceptor 162 is heated to a second temperature by heaters 170.

In operation, for example, the top susceptor 166 can be heated to a higher temperature and the bottom susceptor to a lower temperature. The apparatus 164 is then used to raise the wafer towards the upper susceptor 166 to raise the wafer temperature for annealing, and lower the wafer towards susceptor 162 for the lower temperature required for ALP deposition.

In summary, the improved design includes a reactor that employs a pair of susceptors that envelop the wafer. The use of susceptors to heat the wafer offers several advantages. The space between the susceptors is an isothermal environment resulting in exceptional wafer temperature uniformity. The susceptors rapidly heat the wafers from room temperature to process temperature when a cold water is placed in between hot susceptors. The susceptors form the thermal mass of the system and the inter-susceptor gap defines the flow conductance from the injector to the exhaust port. This arrangement permits multiple wafer sizes to be processed with the same process recipe since the thermal mass of the system and flow conductance through the susceptors are independent of wafer size. As described in pending U.S. patent Ser. No. 10/216,079, if the wafer is a sufficient amount smaller in diameter than the susceptors, the susceptor space prior to the wafer defines a thermal boundary layer. As the reactant gas traverses the thermal boundary layer initiated at the susceptor edge, it gets preheated before it reaches the wafer edge. The flow and gas temperatures are therefore fully established before the gas flow reaches the wafer edge, resulting in a uniform and heated supply of reactant to the wafer surface. As an example, this pre-heating is necessary for the uniform deposition of high quality silicon nitride.

For rapid thermal assisted ALP, the use of susceptors offers additional advantages. The effective chamber volume that is exposed to the process gases is significantly reduced compared to a prior art chamber with larger volume and not having susceptors.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method for processing one or more substrates by atomic layer processing, comprising:
   injecting a first reactant gas into a reactant chamber in which the one or more substrates are disposed, wherein the injecting is performed through a first control valve;
   adjusting the first control valve to a partially closed position to reduce the flow of the first reactant gas;
   injecting a second reactant gas to the reactant chamber through a second control valve while the first reactant gas flows into the reactant chamber at a reduced flow rate,
   wherein the first control valve is set at a plurality of intermediate positions using a slowly varying signal during the adjusting the first control valve.

2. The method of claim 1, further comprising injecting continuously an inert carrier gas into the reactant chamber.

3. The method of claim 1, further comprising:
   charging a first gas reservoir by a source of the first reactant gas, wherein the first reservoir is connected to the first control valve; and
   charging a second gas reservoir by a source of the second reactant gas, wherein the second reservoir is connected to a second control valve.

4. A method for processing one or more substrates by atomic layer processing, comprising:
   injecting a first reactant gas into a reactant chamber in which the one or more substrates are disposed, wherein the injecting is performed through a first control valve;
   adjusting the first control valve to a partially closed position to reduce the flow of the first reactant gas;
   injecting a second reactant gas to the reactant chamber through a second control valve while the first reactant gas flows into the reactant chamber at a reduced flow rate;
   injecting continuously an inert carrier gas into the reactant chamber; and
   adjusting the flow of the inert carrier gas to maintain a stable total gas flow in the reactant chamber.

5. The method of claim 4, wherein the first control valve is set at a plurality of intermediate positions during the adjusting the first control valve.

6. The method of claim 4, further comprising:

charging a first gas reservoir by a source of the first reactant gas, wherein the first reservoir is connected to the first control valve; and charging a second gas reservoir by a source of the second reactant gas, wherein the second reservoir is connected to a second control valve.

* * * * *

UNITED STATES PATENT AND TRADEMARK OFFICE
CERTIFICATE OF CORRECTION

PATENT NO. : 7,393,561 B2 Page 1 of 1
APPLICATION NO. : 10/342151
DATED : July 1, 2008
INVENTOR(S) : Paranjpe It is certified that error appears in the above-identified patent and that said Letters Patent is hereby corrected as shown below:

Column 11, Line 61, please delete "145" and insert --1115-- therefor.

Signed and Sealed this

Second Day of December, 2008

JON W. DUDAS
*Director of the United States Patent and Trademark Office*